(12) United States Patent
Garcia

(10) Patent No.: US 9,636,713 B2
(45) Date of Patent: May 2, 2017

(54) SYSTEMS AND METHODS FOR HANDLING COMPONENTS

(71) Applicant: ELECTRO SCIENTIFIC INDUSTRIES, INC., Portland, OR (US)

(72) Inventor: Douglas J. Garcia, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 197 days.

(21) Appl. No.: 14/147,867

(22) Filed: Jan. 6, 2014

(65) Prior Publication Data

US 2014/0190875 A1 Jul. 10, 2014

Related U.S. Application Data

(60) Provisional application No. 61/749,558, filed on Jan. 7, 2013.

(51) Int. Cl.
*B07C 5/344* (2006.01)
*G01R 31/01* (2006.01)
(Continued)

(52) U.S. Cl.
CPC .................... *B07C 5/344* (2013.01)

(58) Field of Classification Search
CPC .. G01R 1/06705; G01R 31/01; G01R 31/016; G01R 31/2887; G01R 31/2891;
(Continued)

(56) References Cited

U.S. PATENT DOCUMENTS 5,753,299 A * 5/1998 Garcia .................... H05K 3/403
427/146
5,842,579 A * 12/1998 Garcia .................... B07C 5/344
198/393
(Continued)

FOREIGN PATENT DOCUMENTS

JP          2007-93279 A      4/2007
KR            206641 B1       7/1999

OTHER PUBLICATIONS

International Search Report of PCT/US2014/010300, 2 pages.
Written Opinion of PCT/US2014/010300, 5 pages.

*Primary Examiner* — Alesa Allgood

(57) ABSTRACT

A component handler (100) may include: a test plate (102) including multiple circular component-seating tracks (104) each including multiple component-seating sites (500) configured to retain an electrical component (510) such that its face (522) faces away from the test plate (102); a component receiving system (114, 106, 300, 302, 306, 308, 310, 400, 402, 502, and/or 508) positioned along a rotation path of the seating tracks (104); a component test module assembly (1502) for electrically contacting each electrical component (510) seated in a component-seating site (500); one or more collection bins (124); and a collection assembly (120) for collecting some of the electrical components (510) from component-seating sites (500) and directing the electrical components (510) into the bins (124) based on one or more tests conducted at the component test module assembly (1502).

26 Claims, 22 Drawing Sheets

(51) Int. Cl.
*G01F 11/04* (2006.01)
*B25B 11/00* (2006.01)

(58) Field of Classification Search
CPC ............ G01R 1/07342; G01R 31/2863; G01R 31/2889; G01R 31/2893; G01R 31/013; G01R 31/2808; G01R 31/2865; B07C 5/344; H05K 13/021
See application file for complete search history.

(56) References Cited

U.S. PATENT DOCUMENTS

| | | | |
|---|---|---|---|
| 5,842,597 A | 12/1998 | Kraus et al. | |
| 5,844,419 A | 12/1998 | Akram et al. | |
| 5,984,079 A * | 11/1999 | Garcia | G01R 31/013 198/392 |
| 7,161,346 B2 * | 1/2007 | Fish | G01R 31/016 198/392 |
| 8,051,975 B2 * | 11/2011 | Sasaoka | G01R 31/2893 198/478.1 |
| 8,231,323 B2 | 7/2012 | McKeever et al. | |
| 2001/0033179 A1 | 10/2001 | DiFrancesco | |
| 2009/0127169 A1 * | 5/2009 | Boe | G01R 31/2893 209/573 |

* cited by examiner

SYSTEMS AND METHODS FOR HANDLING COMPONENTS

RELATED APPLICATION

This application is a nonprovisional application of U.S. Provisional Application No. 61/749,558, which was filed on Jan. 7, 2013, the contents of which are herein incorporated by reference in their entirety for all purposes.

COPYRIGHT NOTICE

© 2014 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71(d).

TECHNICAL FIELD

This application relates to systems and methods for handling circuit components and, in particular, to systems and methods for quickly and efficiently testing and sorting electronic components.

BACKGROUND

Many electrical components such as passive or active circuit or electronic devices are tested for electrical and optical properties during manufacturing by automated test systems. Typical automatic sorting apparatuses use precision electrical or optical properties of a device and either accept, reject, or sort it into an output category depending on the measured values. For miniature devices, automatic sorting apparatuses are often designed to handle, bulk loads, where the manufacturing process creates a volume of devices that have substantially identical mechanical characteristics such as size and shape but differ in electrical or optical properties that generally fall within a range and rely on testing to sort the components into sort bins containing other components with similar characteristics.

Electronic components are handled by a wide variety of different electronic component handlers. These different handlers include but are not limited to products sold by Electro Scientific Industries Inc. of Portland, Oreg., the assignee of the present patent application. Electro Scientific Industries sells a variety of electronic component handlers including, but not limited to, a high volume MLCC tester sold as the model No. 3300, a chip array tester sold as the model No. 3400, a visual test system sold as the model No. 6650, and a chip array terminator sold as the model No. 753. One such electronic component-testing machine is described in U.S. Pat. No. 5,842,579 entitled Electrical Circuit Component Handler.

SUMMARY

In some embodiments, a test plate is configured for supporting multiple electrical components, wherein each electrical component has a component length dimension, a component width dimension, and a component thickness dimension, wherein each electrical component has a face defined by at least the component length dimension, and wherein the component thickness dimension is shorter than the component length dimension and the component width dimension, wherein the test plate further comprises: a body portion having a first surface and a second surface that is opposite the first surface; and multiple component-seating tracks arranged on the first surface of the body portion, wherein each component-seating track includes multiple component-seating sites, wherein each of the component-seating sites is configured to retain an electrical component such that the face of the electrical component faces away from the first surface.

In some additional or cumulative embodiments, the test plate has a plate thickness dimension that is longer than the component length dimension.

In some additional or cumulative embodiments, each component-seating site has a seating surface region against which an electrical component is retainable, wherein the seating surface region is spaced apart from the second surface.

In some additional or cumulative embodiments, the seating surface region is flush with the first surface.

In some additional or cumulative embodiments, the seating surface region is recessed with respect to the first surface.

In some additional or cumulative embodiments, the test plate has a center and a peripheral edge, wherein the test plate comprises protrusions between adjacent component-seating sites, wherein adjacent protrusions have seating walls that face each other on opposite sides of each component-seating site, wherein each protrusion has a loading wall that is closer to the center than to the peripheral edge, wherein each component-seating site is accessible by a radially proximal aperture between adjacent protrusions, and wherein the radially proximal aperture is closer to the center than to the peripheral edge.

In some additional or cumulative embodiments, each component-seating site is accessible by a radially distal aperture between adjacent protrusions, and wherein the radially distal aperture is closer to the peripheral edge than the center.

In some additional or cumulative embodiments, the test plate is configured for employment in a component handler, wherein the test plate is configured for supporting multiple electrical components, wherein each electrical component has a length dimension, a width dimension, and a thickness dimension, wherein each electrical component has a face defined by at least the length dimension, wherein the thickness dimension is shorter than the length dimension and the width dimension, wherein the test plate has a body portion having a first surface and a second surface that is opposite the first surface, wherein the first surface has a center, wherein the test plate has a circular component-seating track arranged on the first surface of the body portion, wherein the circular component-seating track is concentric about the center of the first surface, wherein the circular component-seating track includes multiple component-seating sites, each configured to retain an electrical component such that the face of the electrical component faces away from the first surface, wherein the test plate is operable to rotate the component-seating sites along a rotation path about the center of the first surface, and wherein the component handler further comprises: a component receiving system, positioned along the rotation path of the seating track, for receiving a stream of components and seating them in the component-seating sites; a component testing station, positioned downstream of the component receiving system and along the rotation path of the seating track, for electrically contacting each electrical component seated in a component-seating site; a collection bin; and a collection assembly, positioned downstream of the component testing station and along the rotation path of the seating track, for collecting at least some of the electrical components from their respective component-seating sites and directing them into the bin after the electrical components have been tested at component testing station.

One of many advantages of these embodiments is that they reduce or eliminate friction between the components and various parts of conventional component handlers and the component handlers described herein.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
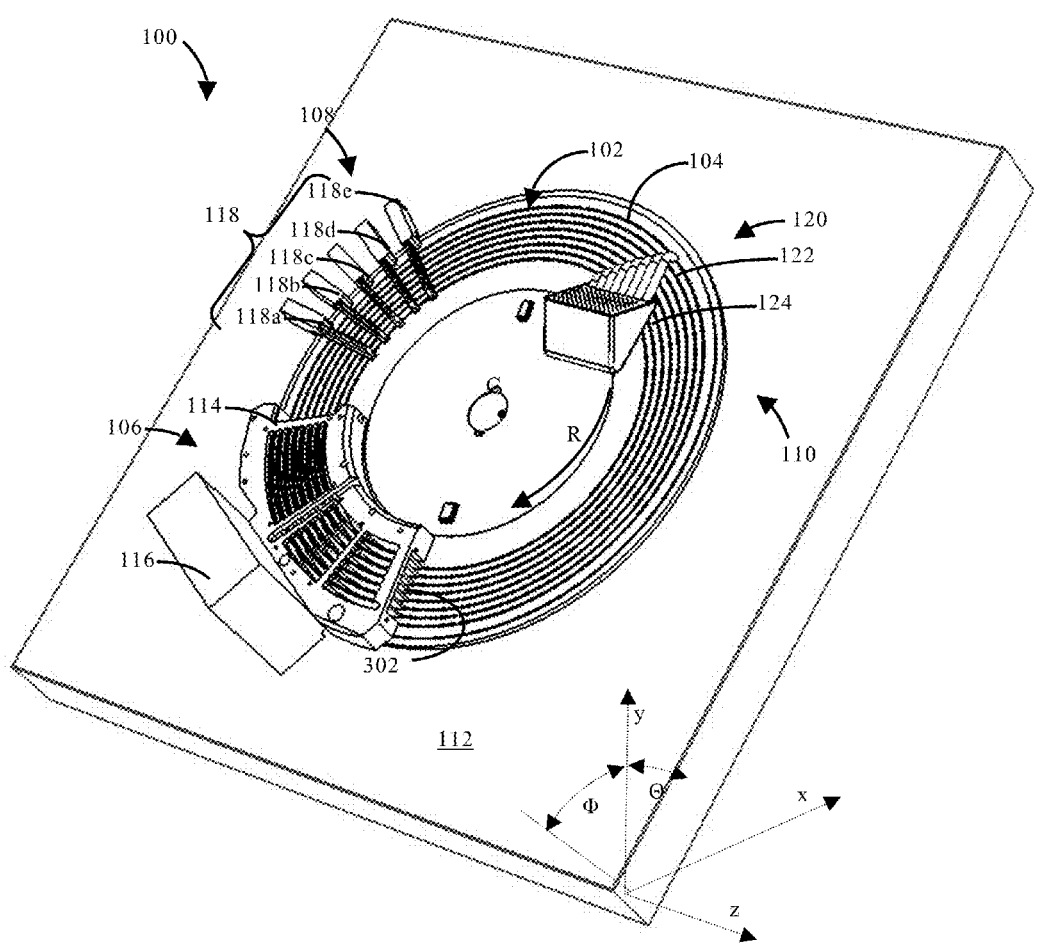
FIG. 1 is a perspective view schematically illustrating a portion of a component handler according to one embodiment.

Example embodiments are described below with reference to the accompanying drawings. Many different forms and embodiments are possible without deviating from the spirit and teachings of the invention and so the disclosure should not be construed as limited to the example embodiments set forth herein. Rather, these example embodiments are provided so that this disclosure will be thorough and complete, and will convey the scope of the invention to those skilled in the art. In the drawings, the sizes and relative sizes of parts may be exaggerated for clarity. The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or parts, but do not preclude the presence or addition of one or more other features, integers, steps, operations, elements, parts, and/or groups thereof. Unless otherwise specified, a range of values, when recited, includes both the upper and lower limits of the range, as well as any sub-ranges therebetween.

Figure 2:
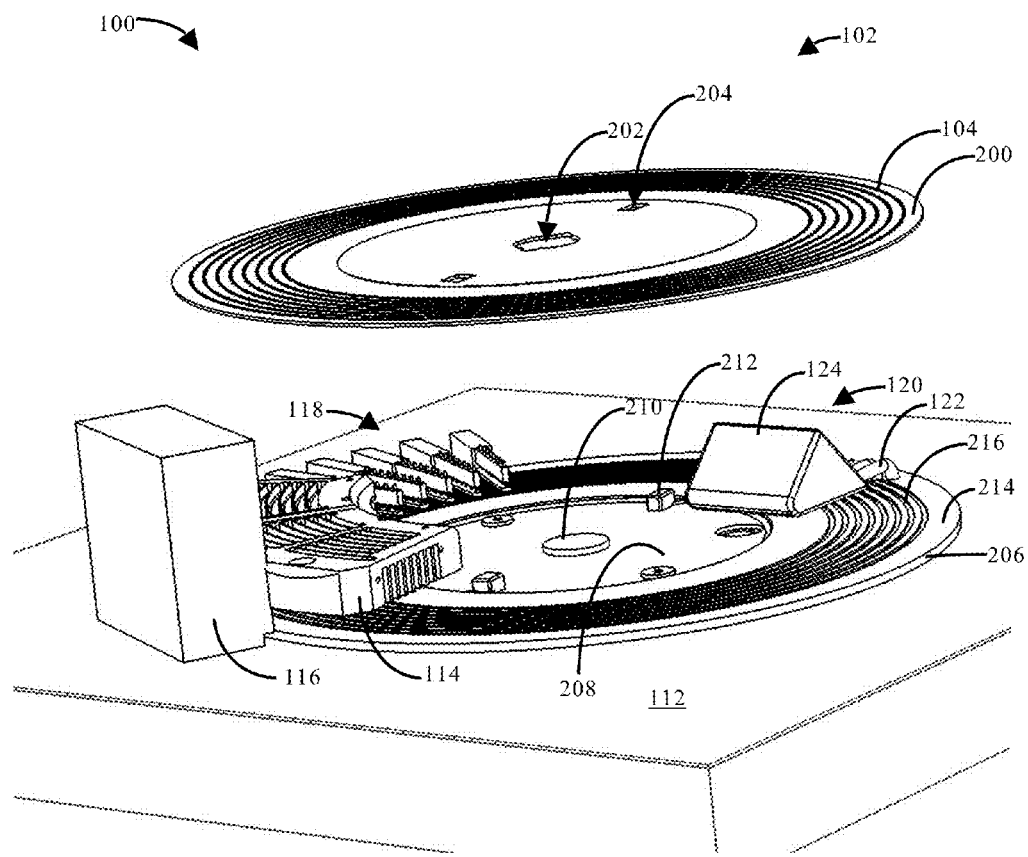
FIG. 2 is a perspective view schematically illustrating the component handler shown in FIG. 1, in which a test plate is removed from a test plate support.

FIG. 1 is a perspective view schematically illustrating a portion of a component handler 100 according to one embodiment. FIG. 2 is a perspective view schematically illustrating the component handler 100 shown in FIG. 1, in which a test plate 102 is removed from a test plate support 206 (which also may commonly be referred to as a "vacuum plate" 206).

Referring to FIGS. 1 and 2, a component handler, such as a component handler 100, is configured to sort components 510 (FIG. 5) into one of a plurality of groups based on one or more measured characteristics of the components 510 (i.e., "component characteristics"). Examples of component characteristics include physical dimensions of a component 510, electrical characteristics (e.g., charge time, leakage current, forward operating voltage, electrical current draw, resistance value, capacitance, dissipation, etc.) of a component 510, optical characteristics (e.g., luminance flux, luminous intensity, spectral light output, dominant wavelength output, peak wavelength output, correlated color temperature, color rendering index, etc.) of a component 510, magnetic characteristics of a component 510, or the like or a combination thereof. Examples of types of components 510 that can be tested, sorted or otherwise handled by the component handler 100 include capacitors (e.g., multi-layer ceramic capacitors (MLCCs), MLCC chip arrays (e.g., two-element MLCC chip arrays, four-element MLCC chip arrays, etc.), etc.), light-emitting diodes (LEDs), chip-scale packages (CSPs), and the like.

Components 510 such as MLCC chip arrays can typically have a length dimension in a range from 0.9 mm to 3.2 mm, a width dimension (e.g., less than or equal to the length dimension) in a range from 0.6 mm to 1.6 mm and a thickness dimension (e.g., less than or equal to the width dimension) in a range from 0.5 mm to 0.95 mm. More generally, MLCC chip arrays and other components 510 may have a length dimension that is shorter than or equal to 3.2 mm, a width dimension that is shorter than or equal to 1.6 mm, and a thickness dimension shorter than or equal to 0.95 mm. However, it will be appreciated that MLCC chip arrays and other components 510 suitable for being handled by the component handler 100 can nevertheless have a length dimension less than 0.9 mm or greater than 3.2 mm, a width dimension less than 0.6 mm or greater than 1.6 mm, and a thickness dimension less than 0.5 mm or greater than 0.9 mm. Generally, values of the length, width and thickness dimensions are unequal, but any two of these dimensions may be equal (or substantially equal). It will also be noted that the width and thickness dimensions will typically be shorter than the length dimension, and the thickness dimension will typically be shorter than the width dimension.

Generally, the component handler 100 is configured to move a circular test plate 102, which is configured to retain components 510 within component-seating tracks 104, and transport components 510 retained therein along component seat travel path from a component-loading region 106 to a component-testing region 108 and then to a component-ejection region 110. In one embodiment, the test plate 102 may have an outer diameter in a range from 30 cm to 40 cm (e.g., in a range from 33 cm to 36 cm). More generally, the test plate 102 may have an outer diameter that is shorter than 40 cm. It will be appreciated, however, that the outer diameter of the test plate 102 may be less than 30 cm or greater than 40 cm. In the illustrated embodiment, the test plate 102 is incrementally moveable (e.g., so as to be indexed), or is continuously moveable, so as to be rotatable along a clockwise direction "R", within a plane that is, at least substantially, parallel to a reference plane 112 (e.g., defined by a base) and about an axis extending through a center "C" of the test plate 102 and perpendicular to the reference plane 112. It will be appreciated that the component handler 100 may alternatively be configured to rotate the test plate 102 in a counter-clockwise direction.

The component-loading region 106 may extend along an arc that is centered on the center C of the test plate 102 and has a central angle in a range from 20 degrees to 180 degrees. The component-testing region 108 may be located outside the component-loading region 106 and extend along an arc, centered on the center C, having a central angle in a range from 20 degrees to 100 degrees. The component-ejection region 110 may be located outside the component-loading region 106 and the component-testing region 108 and extend along an arc, centered on the center C, having a central angle in a range from 20 degrees to 270 degrees. More generally, the component-loading region 106 may extend along an arc having a central angle shorter than or equal to 180 degrees, the component-testing region 108 may extend along an arc having a central angle shorter than or equal to 100 degrees, and the component-ejection region 110 may extend along an arc having a central angle shorter than or equal to 270 degrees. It will be appreciated, however, that the above-described arcs along which each of the component-loading region 106, the component-testing region 108 and the component-ejection region 110 extend may be less than the minimum of stated range, or may be greater than the maximum of the stated range. It will also be noted that the central angle of the component-testing region 108 will typically be shorter than those of the component-loading region 106 and the component-ejection region 110, and the central angle of the component-loading region 106 may be shorter than that of the component-ejection region 110.

The reference plane 112 may be inclined at a first inclination angle, $\Theta$, relative to a reference plane (e.g., a plane extending in the "y" and "z" directions, in which the "x", "y" and "z" directions are mutually orthogonal and "y" is, at least substantially, vertical). In one embodiment, the first inclination angle, $\Theta$, is in a range from 5 degrees to 85 degrees. In another embodiment, the first inclination angle, $\Theta$, is in a range from 20 degrees to 40 degrees (e.g., 30 degrees, or thereabout). More generally, it will be noted that the first inclination angle, $\Theta$, may shorter than or equal to 85 degrees or may be shorter than or equal to 40 degrees. Also, the first inclination angle, $\Theta$, may be greater than or equal to 5 degrees or may be greater than or equal to 20 degrees. It will be appreciated, however, that the first inclination angle, $\Theta$, may be less than 5 degrees or greater than 85 degrees.

In some embodiments, the test plate 102 includes multiple circular component-seating tracks 104, radially offset but concentric relative to one another and with the center C of the test plate 102. In the illustrated embodiment, the test plate 102 includes eight such circular component-seating tracks 104. As will be discussed in greater detail below, each component-seating track 104 includes a plurality of component-seating sites 500 (FIG. 5) circumferentially distributed about the center C, wherein a component 510 is retainable at a respective component-seating site 500. Thus upon rotating the test plate 102, the component-seating sites 500 within each component-seating track 104 travel along a circular path (also referred to herein as a "component seat travel path") of, at least substantially, constant radius from center C.

In one embodiment, the number of component-seating sites 500 in each component-seating track 104 may be in a range from 200 to 400. More generally, it will be noted that the number of component-seating sites 500 in each component-seating track 104 may be less than 1000, or less than 500. It will be appreciated, however, that each component-seating track 104 may include less than 200 or greater than 400 component-seating sites 500.

Because the test plate 102 rotates within a plane that is inclined at the first inclination angle, Θ, the component seat travel path includes a first portion that is elevationally higher than a second portion thereof. Although FIGS. 1 and 2 illustrate the test plate 102 as including eight component-seating tracks 104, it will be appreciated that the test plate 102 may include any number of component-seating tracks 104 (e.g., 1, 2, 4, 6, 9, 10, etc.) depending on factors such as: the radial distance between adjacent component-seating tracks 104, the size of components 510 to be retained at the component-seating sites 500, the number and arrangement of component-seating sites 500 within each component-seating track 104, the diameter of the test plate 102, or the like or a combination thereof.

As best shown in FIG. 2, in addition to the aforementioned component-seating tracks 104, the test plate 102 may be characterized as including a disk-shaped body portion 200, a drive hole 202 and locator holes 204. The body portion 200 may be formed of one or more materials such as polyphenylene sulfide, polycarbonate (20% glass filled), reinforced nylon, FR-4 epoxy glass, alumina ceramic, or the like, or any combination thereof. Further, the body portion 200 may be characterized as including a peripheral region, at which the component-seating tracks 104 are located, and a central region, within which the drive hole 202 and one or more locator holes 204 are formed. Regions of a top surface (also referred to herein as a "first surface") of the body portion 200 located radially inwardly adjacent to the component-seating tracks 104 are herein referred to as "loading surface regions." (For convenience, a radially inward direction 320 toward center C and a radially outward direction 322 away from center C are depicted by arrows in FIGS. 3 and 8.) When the test plate 102 is mounted on the component handler 100, a portion of a loading surface region located in the component-loading region 106 is elevationally above a corresponding portion of a corresponding component-seating track 104.

The thickness of the body portion 200 at the loading surface regions 402 (FIG. 4) may be greater than any of the length, width, or thickness dimensions of the components 510 to be handled. Test plates 102 formed of body portions 200 having a thickness less than the length of the component 510 being handled tend to be undesirably flexible in torsional directions, and expensive to manufacture. Accordingly, the test plate 102 according to the embodiments discussed herein can desirably be made relatively more rigid than conventional test plates, and at less cost.

The component handler 100 may further include a stationary test plate support 206 configured to support the test plate 102 and a rotatable turntable 208 configured to move (e.g., rotate) the test plate 102 along the direction R. The turntable 208 may include a hub 210 and one or more locator pins 212. Upon mounting the test plate 102 onto the turntable 208, the hub 210 is inserted into the drive hole 202 of the test plate 102, the one or more locator pins 212 are inserted into corresponding ones of the locator holes 204 of the test plate 102, and the test plate 102 is placed closely adjacent to or in contact with a support surface 214 (e.g., parallel, or at least substantially parallel, with the reference plane 112) of the test plate support 206.

A motor (not shown) may be actuated to rotate the turntable 208 (e.g., either continuously or incrementally). Upon rotating the turntable 208, the test plate 102 is also rotated (e.g., either continuously or incrementally) as discussed above, relative to the test plate support 206. In one embodiment, the support surface 214 is formed of a material having one or more desirable characteristics such as a low coefficient of friction with the test plate 102, a high resistance of friction to wear as the test plate 102 rotates relative to the test plate support 206, a high resistance to corrosion, or the like. In one embodiment, the support surface 214 is formed of a material such as ultra-high-molecular-weight polyethylene (UHMWPE), polytetrafluoroethylene (PTFE), a hard chrome plating, or the like or a combination thereof. By forming the support surface 214 in the manner discussed above, the frictional load on the test plate support 206 and the test plate 102 can be reduced. In embodiments in which the test plate 102 is incrementally rotated, the reduced frictional load can improve the indexing accuracy and speed at which the test plate 102 is rotated about its central axis.

In some embodiments, as discussed in greater detail below, the components 510 may be retained at one or more component-seating sites 500 by a partial vacuum or suction force applied thereto, through one or more corresponding vacuum transmission passages (not shown) formed in the test plate 102. In such embodiments, the test plate support 206 may further include one or more vacuum channels 216 formed in the support surface 214 and configured to be in fluid communication with a low-pressure source (not shown) and the vacuum transmission passages.

During operation of the component handler 100, the suction force can be transmitted from the low-pressure source, through the vacuum channels 216 and vacuum transmission passages, to the component-seating sites 500 of the component-seating tracks 104. In one embodiment, the suction force may be continuously transmitted from the low-pressure source so that the components 510 can be retained at component-seating sites 500 as the test plate 102 rotates, transporting retained components 510 from the component-loading region 106 to the component-testing region 108 and, thereafter, to the component-ejection region 110.

In one embodiment, the test plate 102 is configured such that a component 510 retained at a component-seating site 500 does not contact the test plate support 206. By preventing the components 510 retained at component-seating sites 500 from contacting the test plate support 206, damage to portions of the components 510 (e.g., to metallic terminations of the components 510) due, for example, to sliding contact of the component portions with the support surface 214 can be avoided. Likewise, by preventing the components 510 retained at component-seating sites 500 from contacting the test plate support 206, damage to the support surface 214 due to, for example, to sliding contact of the portions of the components 510 with the support surface 214, can also be avoided.

Referring again to FIGS. 1 and 2, the component handler 100 may include a load frame assembly disposed within the component-loading region 106. In one embodiment, the load frame assembly includes a load frame 114 and a load frame support 116.

The load frame 114 may be configured to facilitate the loading of the components 510 into respective component-seating sites 500 of the test plate 102. The load frame 114 may include a plurality of spaced-apart load fences 302 (FIG. 3), wherein each load fence 302 is disposed over and closely adjacent to a corresponding component-seating track 104 of the test plate 102. Generally, each load fence 302 may extend along the second, elevationally lower, portion of a corresponding component seat travel path. In one embodiment, at least one load fence 302 may extend along an arc having a central angle in a range from 20 degrees to 180 degrees. More generally, the central angle may be smaller than 180 degrees. For example, the arc may have a central angle in a range from 40 degrees to 120 degrees. In another example, the arc may have a central angle in a range from 45 degrees to 90 degrees. It will be appreciated, however, that the arc may have a central angle less than 20 degrees or greater than 180 degrees.

Generally, the component-loading region 106 is present at or near the elevationally lowest region of each of the component seat travel paths. Accordingly, at least one load fence 302 can be present at the elevationally lowest portion of a corresponding component seat travel path, or may be absent from the elevationally lowest portion of the corresponding component seat travel path. In one embodiment, the load frame 114 may be located relative to the test plate 102 in a manner similar to that as exemplarily described in U.S. Pat. No. 5,842,597, which is incorporated herein by reference in its entirety.

Generally, each load fence 302 is inclined relative to the test plate 102 at a second inclination angle, $\phi$, relative to the reference plane in a range from 5 degrees to 85 degrees. In one embodiment, the second inclination angle $\phi$ is in a range from 20 degrees to 70 degrees (e.g., 60 degrees, or thereabout). More generally, the second inclination angle is smaller than 85 degrees. It will be appreciated, however, that the second inclination angle $\phi$ may be less than 5 degrees or greater than 85 degrees. In one embodiment, the sum of the first and second inclination angles inclination angles, $\Theta$ and $\phi$, respectively, may be in a range from 10 degrees to 170 degrees (e.g., 90 degrees, or thereabout).

Components 510 may be fed into a component-receiving space adjacent to each load fence 302 of the load frame 114 by an assembly (not shown) including a feeder tray configured to receive components 510 from a hopper and further configured to convey the components 510 to a funnel upon being shaken by a shaker. Such an assembly may exemplarily be provided as the assembly described in U.S. Pat. No. 5,842,597. Upon being fed into a component-receiving space 306, a component 510 is guided to a corresponding loading surface region 402 of the test plate 102 (e.g., under the influence of gravity) by one or more load fences 302 adjacent thereto. Thereafter, the test plate 102 turns in the clockwise direction "R;" and, due to gravity, the components 510 tumble in the opposite direction along the loading surface region 402 of the test plate 102. The process of feeding components 510 into component-receiving spaces 306, guiding fed components 510 to the test plate 102 and tumbling the components 510 may be performed in a similar manner as exemplarily discussed in U.S. Pat. No. 5,842,597. Eventually, and as will be discussed in greater detail below, a component 510 tumbling along the loading surface region 402 will be captured (e.g., under the influence of gravity) within a component-seating chamber 800 (FIG. 8) including a component-seating site 500 of a corresponding component-seating track 104. As will also be discussed in greater detail below, a captured component 510 can be secured or retained at the component-seating site 500 by a component retention mechanism.

While a component 510 is retained at a component-seating site 500, the test plate 102 can be moved (e.g., rotated along the direction R) to transport the component 510 from the component-loading region 106 to the component-testing region 108 and, thereafter, to the component-ejection region 110. Although not illustrated, the load frame assembly may further include one or more orientation-correction mechanisms configured to ensure that the components 510 fed into the component-receiving spaces are properly oriented relative to corresponding ones of the component-seating tracks 104 so that components 510 can be efficiently captured within a component-seating chamber 800. Examples of orientation-correction mechanisms include air knives, protrusions extending from load fences 302 into adjacent component-receiving spaces near the test plate 102, or the like or a combination thereof.

The load frame support 116 may be coupled to the base and be configured to hold the load frame 114 over the test plate 102 (e.g., so that, as the test plate 102 rotates, the load frame 114 remains, at least substantially, stationary relative to the test plate 102). In one embodiment, the load frame support 116 may be configured (e.g., with one or more parts such as screws, springs, bearings, rails, pegs, levers, clamps, or the like or a combination thereof) such that the position of the load frame 114 can be adjusted radially (e.g., with respect to the center C), circumferentially (e.g., about the center C), axially (e.g., in a direction parallel to the axis of rotation, extending through center C), or the like or a combination thereof. In one embodiment, the load frame support 116 may be provided in a manner as exemplarily described in U.S. Pat. No. 8,231,323, which is incorporated herein by reference in its entirety.

The component handler 100 may include test module assemblies, such as a first test module assembly 118a, a second test module assembly 118b, a third test module assembly 118c, a fourth test module assembly 118d and a fifth test module assembly 118e (collectively and generically referred to as "test module assemblies 118"), disposed within the component-testing region 108. Although FIGS. 1 and 2 illustrate an embodiment in which five test module assemblies 118 are disposed within the component-testing region 108, it will be appreciated that any number of test module assemblies 118 (e.g., 1, 2, 3, 4, 6, 7, etc.) may be disposed within the component-testing region 108.

Generally, a test module assembly 118 is coupled to the base and includes a plurality of test modules disposed over the test plate 102, wherein each test module is located over a corresponding component-seating track 104 and defines a component-testing site (not shown) of the component handler 100. Each test module may be configured to sense, detect, or measure one or more of the aforementioned component characteristics of a component 510 retained at a component-seating site 500 of a component-seating track 104. In one embodiment, test modules within a common test module assembly 118 are configured to sense, detect, or measure the same component characteristic(s) of a component 510. In another embodiment, at least two test modules within a common test module assembly 118 are configured to sense, detect, or measure different component characteristics of a component 510. In one embodiment, test modules within different test module assemblies 118 are configured to sense, detect, or measure different component characteristics of the same component 510. In another embodiment, at least two test modules within different test module assemblies 118 are configured to sense, detect, or measure the same component characteristic(s) of the same component 510. In one embodiment, test modules within the first test module assembly 118a are configured to perform the first stage test discussed in U.S. Pat. No. 5,842,597, test modules within the second test module assembly 118b are configured to perform the second stage test discussed in U.S. Pat. No. 5,842,597, test modules within the third test module assembly 118c are configured to perform the third stage test discussed in U.S. Pat. No. 5,842,597, test modules within the fourth test module assembly 118d are configured to perform the fourth stage test discussed in U.S. Pat. No. 5,842,597 and test modules within the fifth test module assembly 118e are configured to perform the fifth stage test discussed in U.S. Pat. No. 5,842,597.

The component handler 100 may include one or more collection assemblies, such as collection assembly 120, disposed within the component-ejection region 110. In one embodiment, the collection assembly 120 includes a plurality of collection tubes 122 and a collection bin 124.

Each collection tube 122 of a collection assembly 120 is located over a corresponding component-seating track 104 at a location corresponding to a component-ejection site (not shown) of the component handler 100. Further, each collection tube 122 is configured to receive a component 510 ejected from the test plate 102 and guide the received components 510 into one or more collection bins, such as a collection bin 124, which may be removable from the collection tubes 122 or component handler 100 by any suitable or beneficial method.

Although not illustrated, the component handler 100 may further include a collection support coupled to the base and configured to hold the collection assembly 120 over the test plate 102 (e.g., so that, as the test plate 102 rotates, the collection assembly 120 remains, at least substantially, stationary relative to the test plate 102). The collection support may further be configured (e.g., with one or more parts such as screws, springs, bearings, rails, pegs, levers, clamps, or the like or a combination thereof) such that the position of the collection tubes 122 can be adjusted radially (e.g., with respect to the center C), circumferentially (e.g., about the center C), axially (e.g., in a direction parallel to the axis of rotation, extending through center C), or the like or a combination thereof.

Although FIGS. 1 and 2 illustrate an embodiment in which only one collection assembly 120 is disposed within the component-ejection region 110, it will be appreciated that any number of collection assemblies 120 (e.g., 2, 3, 4, 5, 6, 7, etc.) may be disposed within the component-ejection region 110. In another embodiment, the component handler 100 may include an ejection manifold and associated parts as exemplarily described in U.S. Pat. No. 5,842,597, to which one or more of collection assembly 120 may be coupled.

Although the component handler 100 is described as including one or more collection assemblies 120 for collecting ejected components 510, it will be appreciated that ejected components 510 may be collected by any other mechanism. For example, one or more of the collection assemblies 120 may be replaced with one or more parts such as the ejection tubes, tube routing plate, bins, and bin trays as exemplarily described in U.S. Pat. No. 5,842,597.

In another example, the collection tubes 122 for the collection bin 124 are replaced by a common collection manifold. The collection manifold may, for example, be asymmetrical to create a larger or varied cross sectional area within the manifold and allow a greater range of trajectory of the components 510 upon ejection from the test plate 102. The trajectory along which a component 510 is ejected may vary depending on the particular geometry of the component 510. A variable geometry collection manifold can afford less reduction of the ejected components' velocity as it allows a greater range of component trajectory, reducing the frequency of or severity of impact of the component 510 to the inner surface of the collection manifold. This, in turn can improve the efficiency of the component collection because the ejected component 510 can more successfully travel all the way to the collection bin 124. In one embodiment, the collection manifold may include discrete apertures each configured to receive components 510 ejected from a different ejection site, or may have an enlarged aperture that is configured to receive components 510 ejected from different ejection sites. In another embodiment, the collection manifold can be configured with passageways that communicate with individual apertures at one end thereof and, at another end, coalesce into one or more other passageways (e.g., so as to reduce the number of passageways that lead to a collection bin 124 to as few as one.

In the illustrated embodiment, the distance that an ejected component 510 travels until it reaches a collection bin 124 (e.g., as defined by a collection tube 122, a collection manifold, or the like or a combination thereof) can be relatively short (e.g., about 1 to 10 inches long). The collection bin 124 is thus located relatively closely to the end of the collection tube 122 (or collection manifold) and closely to the component-ejection site. By reducing the overall distance ejected components 510 travel until entering a collection bin 124, the likelihood that the component 510 will be damaged as a result of the ejection process can be reduced. Also, by locating the collection bin 124 relatively closely to the component-ejection site, the component handler 100 can be made more compact, reducing the footprint of the machine. In the embodiments discussed above, any of the collection tubes 122 (or collection manifolds) may be fixed to a collection bin 124 or may be integrally formed with the collection bin 124.

As exemplarily described above, components 510 may be delivered, in bulk, to the component handler 100, and the component handler 100 is configured to separate or singulate individual components 510 and retain the individualized components 510 at component-seating sites 500 distributed among one or more component-seating tracks 104. Thereafter, component characteristics of components 510 retained at component-seating sites 500 of common or different component-seating tracks 104 in may be sensed, detected, or measured in parallel, in series, or a combination thereof. Components 510 retained at component-seating sites 500 of common or different component-seating tracks 104 may then be ejected, in parallel, in series, or a combination thereof, into one of a number of collection bins 124 according to their sensed, detected, or measured component characteristics (i.e., "sorted"). Thus, the component handler 100 described herein can facilitate high-throughput handling of components 510. Having broadly described various aspects and embodiments of the component handler 100 associated with the component-loading, -testing and -ejection regions above with respect to FIGS. 1 and 2, some example embodiments of the test plate 102 and other features, aspects, implementations, or configurations of the component handler 100 will now be described below with respect to FIGS. 3 to 20.

Figure 3:
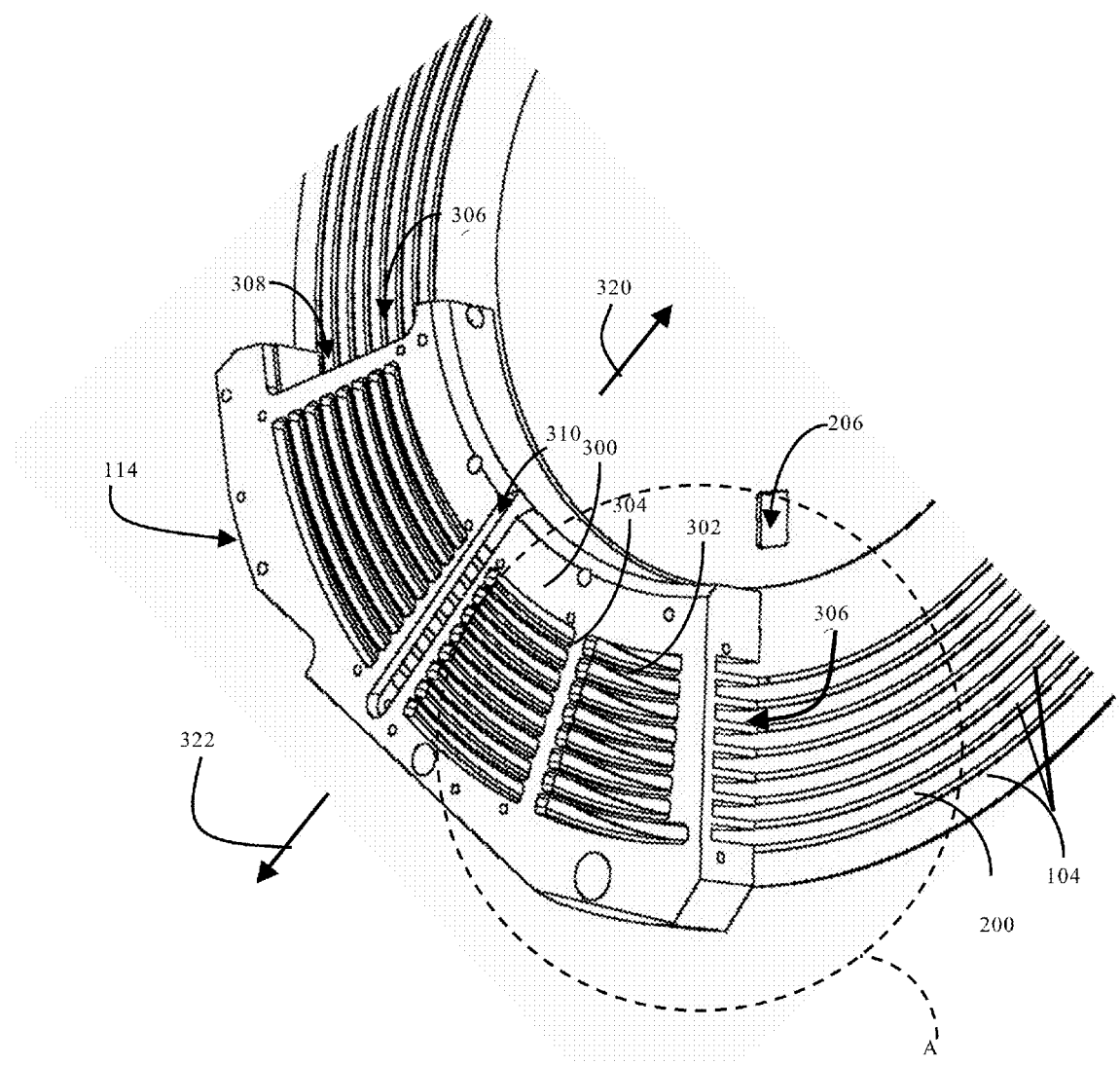
FIG. 3 is an enlarged perspective view schematically illustrating a portion of the test plate and load frame within the component-loading region of the component handler shown in FIG. 1, according to one embodiment.
Figure 4:
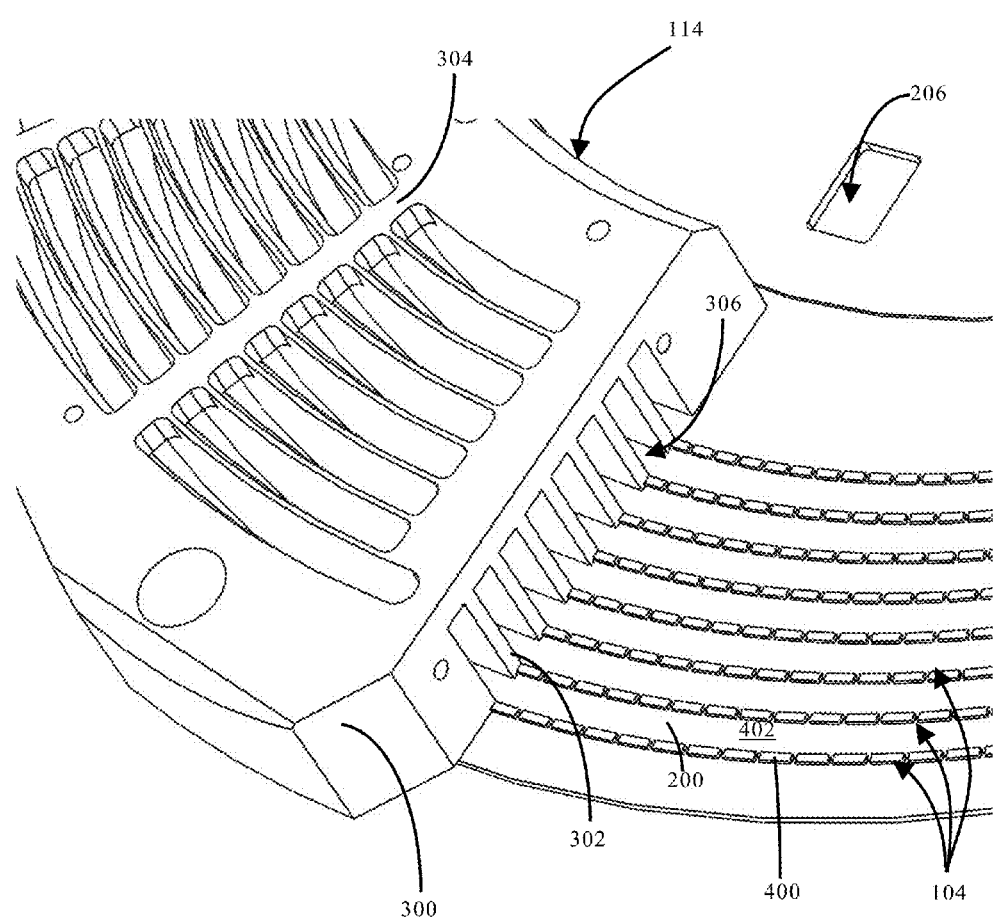
FIG. 4 is an enlarged perspective view schematically illustrating region "A" shown in FIG. 3.
Figure 4A:
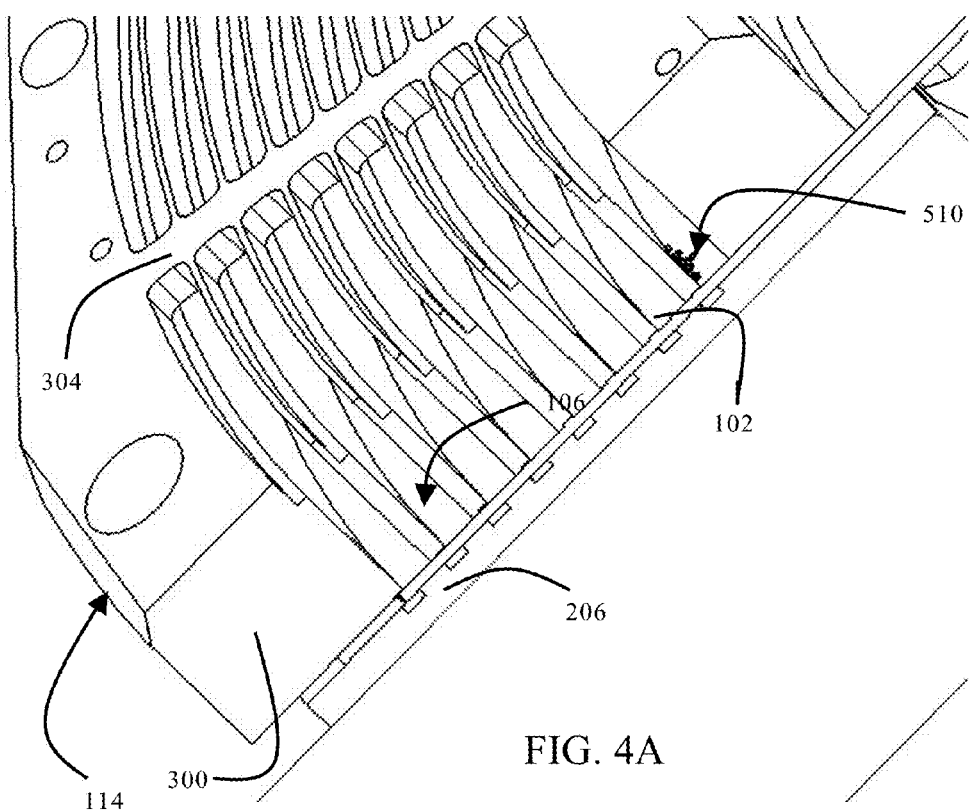
FIG. 4A is an enlarged cross-sectional view of a portion of the load frame.
Figure 4B:
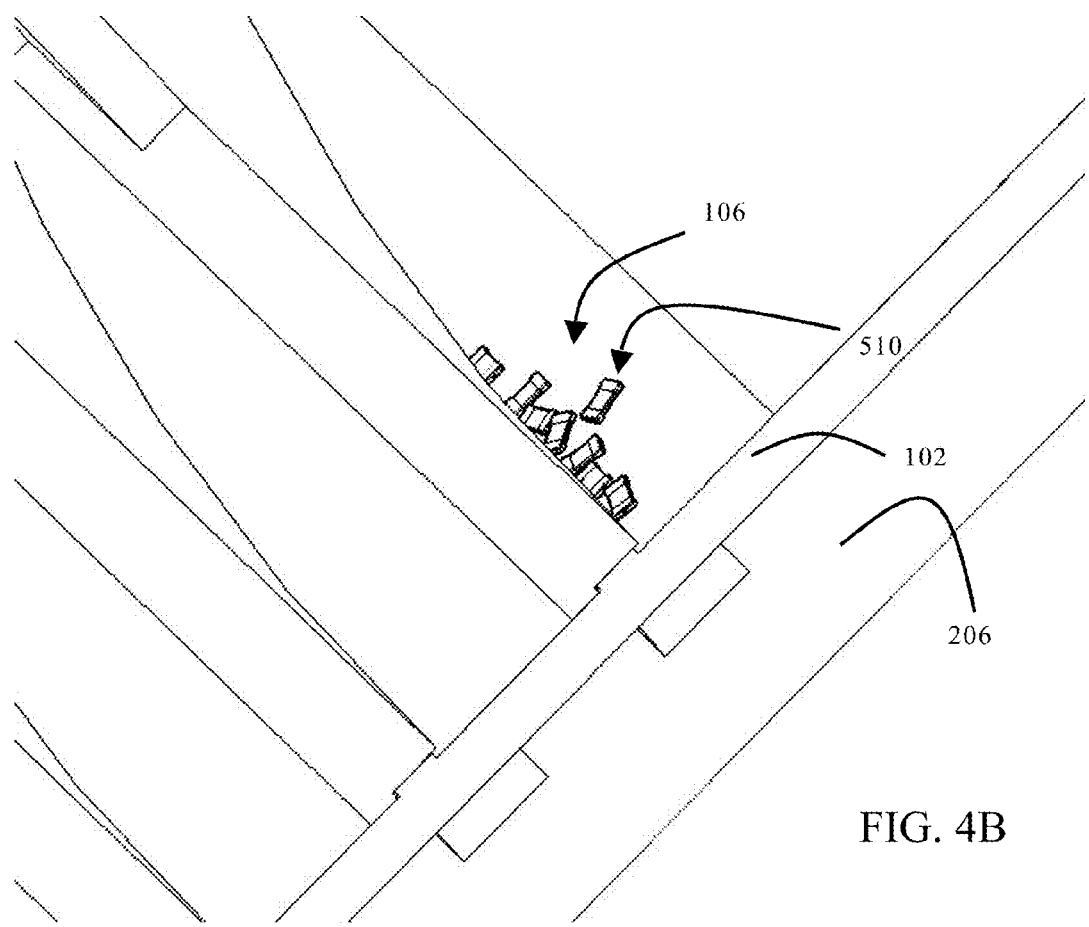
FIG. 4B is a more enlarged cross-sectional view of a portion of the load frame, emphasizing the component-loading region.
Figure 4C:
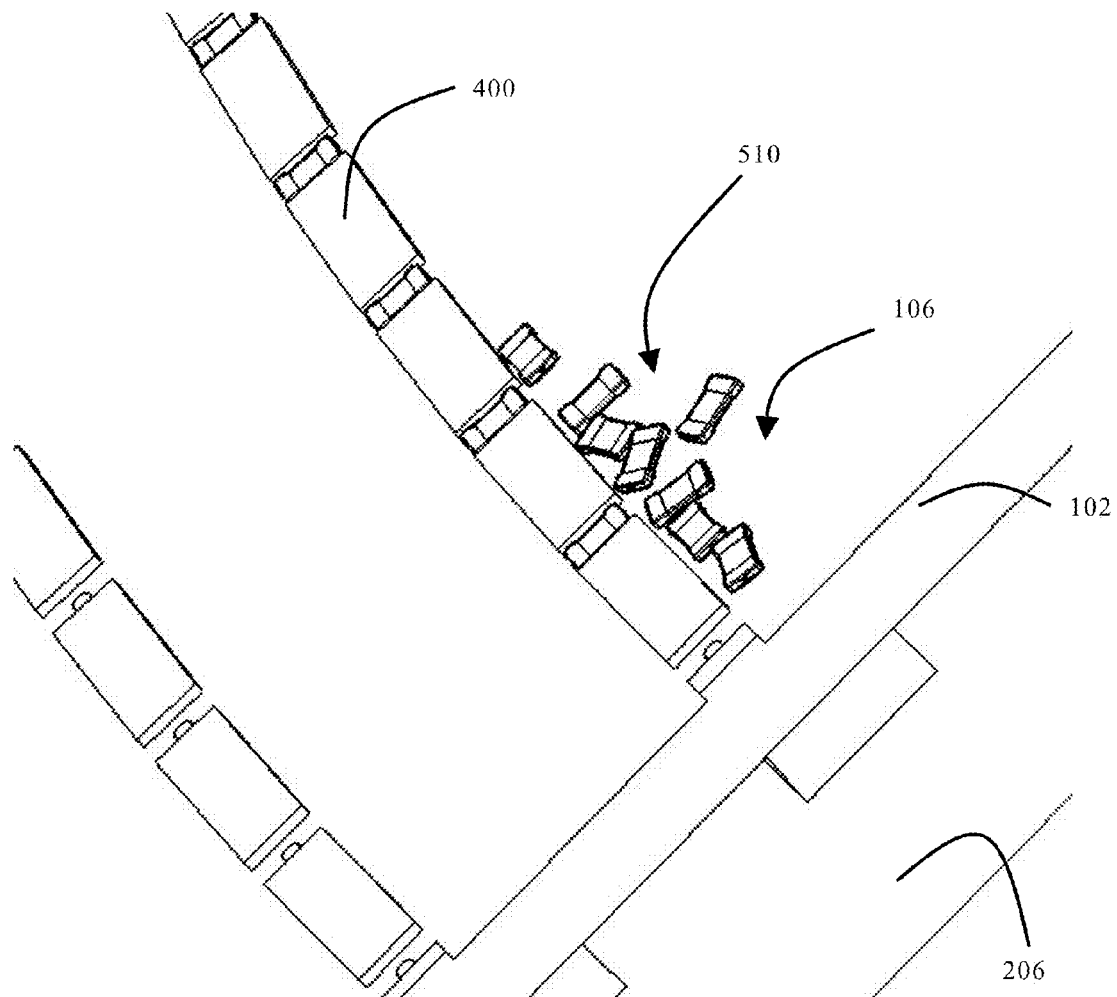
FIG. 4C is an even more enlarged cross-sectional view of the component-loading region with the load frame removed.
Figure 5:
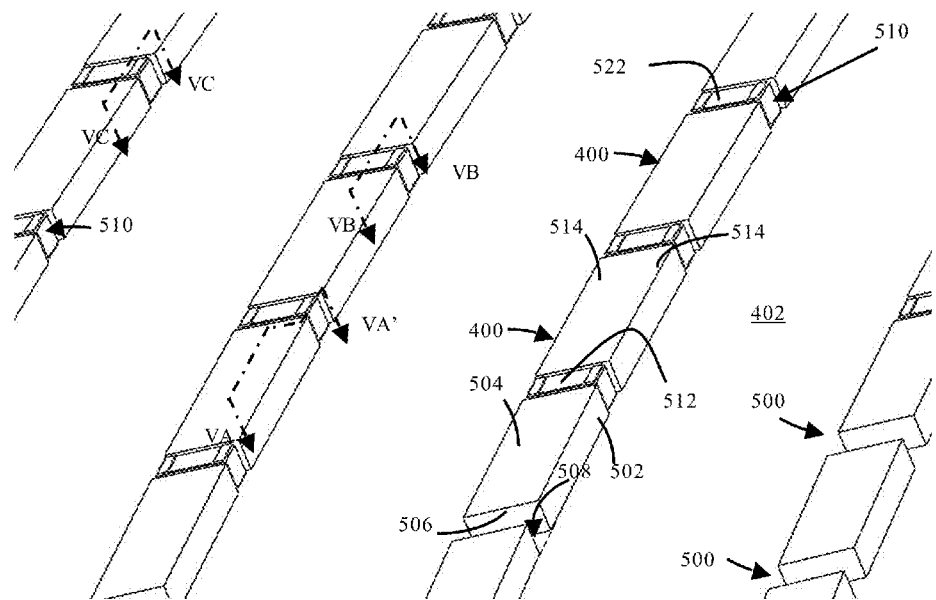
FIG. 5 is an enlarged perspective view schematically illustrating a portion of the component-seating tracks shown in FIG. 4, according to one embodiment.
Figure 6:
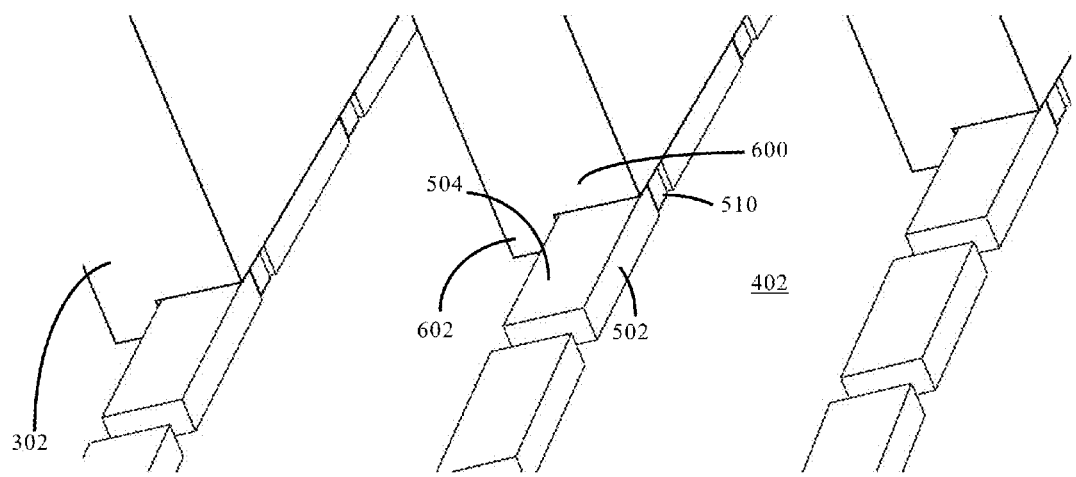
FIG. 6 is an enlarged perspective view schematically illustrating load fences according to one embodiment, and the loading of components at respective component-seating sites defined by the component-seating tracks shown in FIG. 5.
Figure 7:
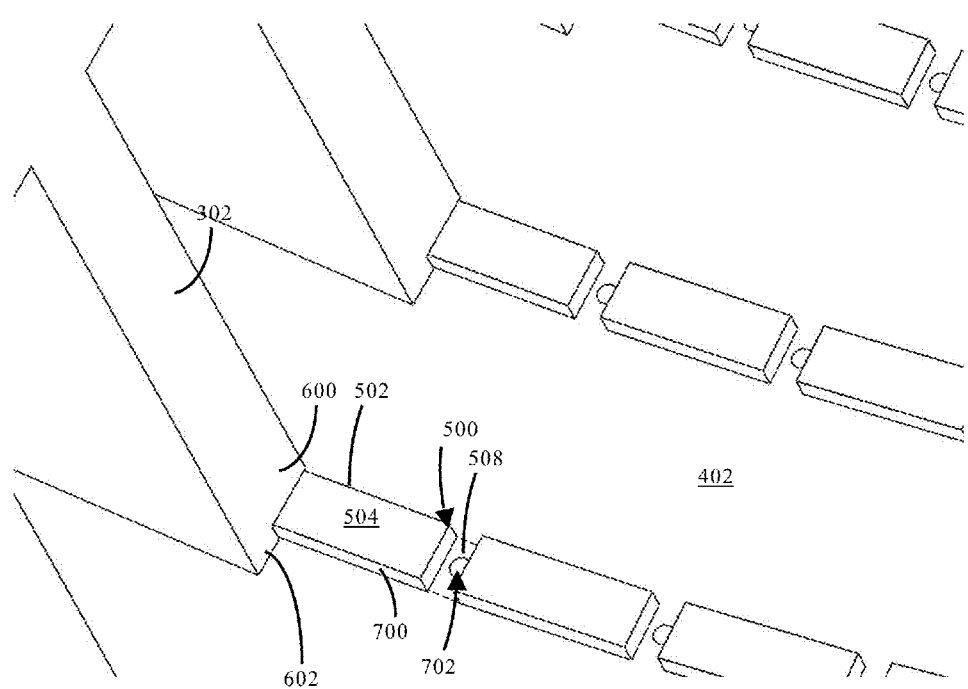
FIG. 7 is an enlarged perspective view schematically illustrating the load fences shown in FIG. 6, taken from an opposing angle from that shown in FIG. 6.
Figure 8:
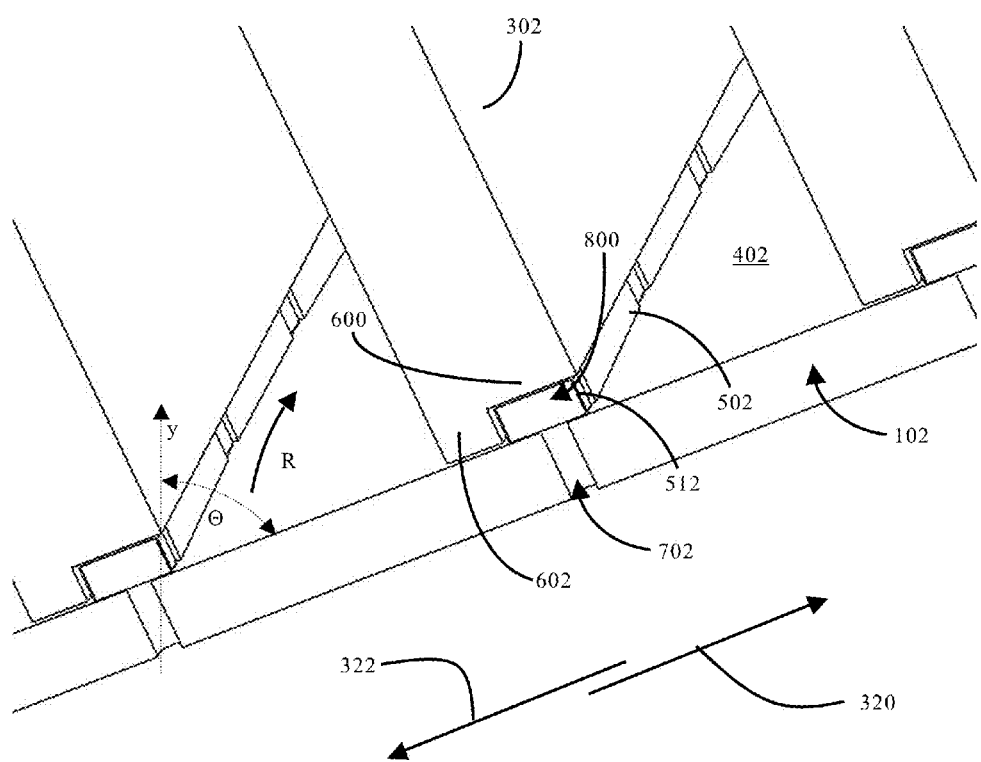
FIG. 8 is a cross-sectional view illustrating the load fences shown in FIGS. 6 and 7, and components captured within respective component-seating chambers.

FIG. 3 is an enlarged perspective view schematically illustrating a portion of the test plate 102 and load frame 114 within the component-loading region 106 of the component handler 100 shown in FIG. 1, according to one embodiment. FIG. 4 is an enlarged perspective view schematically illustrating region "A" shown in FIG. 3. FIG. 4A is an enlarged cross-sectional view of a portion of the load frame 114; FIG. 4B is a more enlarged cross-sectional view of a portion of the load frame 114, emphasizing the component-loading region 106; and FIG. 4C is an even more enlarged cross-sectional view of the component-loading region 106 with the load frame 114 removed. FIG. 5 is an enlarged perspective view schematically illustrating a portion of the component-seating tracks 104 shown in FIG. 4, according to one embodiment. FIG. 6 is an enlarged perspective view schematically illustrating load fences 302 according to one embodiment, and the loading of components 510 at respective component-seating sites 500 defined by the component-seating tracks 104 shown in FIG. 5. FIG. 7 is an enlarged perspective view schematically illustrating the load fences 302 shown in FIG. 6, taken from an opposing angle from that shown in FIG. 6. FIG. 8 is a cross-sectional view illustrating the load fences 302 shown in FIGS. 6 and 7, and components 510 captured within respective component-seating chambers 800.

Referring to FIGS. 3, 4, 5, and 7, the component-seating tracks 104 are arranged on the test plate 102 such that, when the test plate 102 is mounted on the component handler 100, each component-seating track 104 is, at least substantially, aligned with and disposed below a corresponding load fence 302.

As best shown in FIGS. 4 and 5, each component-seating track 104 may include a plurality of spaced-apart projections 400 extending from the top surface of the body portion 200, wherein a component-seating site 500 is located within the space between each pair of adjacent projections 400. The projections 400 (also referred to as "protrusions") may be integrally formed with the body portion 200, or may be formed separately from the body portion 200 and subsequently attached thereto (e.g., by an adhesive, by a chemical or physical bond or weld between the body portion and the projections 400, or the like or a combination thereof). Regions of the surface of the body portion 200 located radially inwardly adjacent to the component seat tracks 104, such as region 402, are herein referred to as the aforementioned "loading surface regions". As best shown in FIG. 5, each projection 400 may include a loading wall 502, a terminal surface 504, and a pair of seating walls 506. The loading wall 502 is a radially inner wall that extends from a corresponding loading surface region 402 to the terminal surface 504. Each seating wall 506 defines the circumferential extent of a portion of a component-seating site 500. Regions of the surface of the test plate 102 located circumferentially between seating walls 506 of pairs of adjacent projections 400, such as region 508, are herein referred to as "seating surface regions" and may be coplanar with the loading surface region 402 adjacent thereto, or may be recessed relative to the adjacent loading surface region 402. In the illustrated embodiment, the seating surface region 508 defines a plane that is, at least substantially, parallel with the reference plane 112. Recessing the seating surface region 508 relative to the loading surface region 402 may aid in retention of the component 510 at the component-seating site 500, as well as helping to correctly orient the component 510 at the component-seating site 500.

The circumferential distance between seating walls 506 of pairs of adjacent projections 400 may define the width of a component-seating site 500. Similarly, the radial extent of a seating wall 506 may define the length of a component-seating site 500. Generally, the width of a component-seating site 500 is slightly larger than the width dimension of the component 510 to be retained thereat. However, the length of a component-seating site 500 may be longer, shorter, or equal to the length dimension of the component 510 to be retained thereat. In one embodiment, the distance between the terminal surface 504 of a projection 400 and the surface loading region 402 adjacent thereto may be greater than, equal to, or less than the thickness dimension of the component 510 located at an adjacent component-seating site 500. In another embodiment, the distance to which the loading wall 502 protrudes above the surface loading region 402 may be greater than, equal to, or less than the thickness dimension of the component 510 located at an adjacent component-seating site 500.

As exemplarily illustrated, the components 510 may be MLCCs, each including a body 512 generally defining the length, width and thickness dimensions of the component 510, and two (or more) plated terminations (e.g., electrodes, terminals, etc.) 514 disposed at opposite ends of the component body 512, wherein the opposite ends are separated by the length dimension of the component 510. It will be appreciated, however, that any of the components 510 may alternatively be provided as an MLCC chip array (e.g., a two-element MLCC chip array, a four-element MLCC chip array, etc.), a light-emitting diode (LED), a chip-scale package (CSP), or the like.

Referring to FIG. 7, a plurality of passages, such as passage 702, may extend through the test plate 102. As exemplarily illustrated, a seating site outlet of each passage 702 intersects (i.e., is formed within) the seating surface region 508 of a corresponding component-seating site 500. In one embodiment, and as discussed in greater detail below, the passages 702 may be used to facilitate ejection of a component 510 from the test plate 102 when the component-seating site 500 of the seated component 510 is operably proximate to a component-ejection site. In another embodiment, and as discussed in greater detail below, the passages 702 may be used to facilitate retention of a component 510 at a component-seating site 500 as the test plate 102 is rotated. Although FIG. 7 illustrates only one passage 702 opening into a component-seating site 500, it will be appreciated that any number of passages 702, configured in any shape and/or size, may open into the same component-seating site 500.

Referring to FIGS. 3, 4, 6, 7, and 8, the load frame 114 may include a containment body 300 and a plurality of generally arcuate load fences 302 coupled to the containment body 300 by a cross-members such as a cross member 304. Components 510 may be selectively fed into one or more component-receiving spaces, such as a component-receiving space 306 (adjacent to each load fence 302 and above the respective loading surface region 402), from a feeding port 308 located at one end of the load frame 114, from a feeding port 310 located between ends of the load frame 114, or the like or a combination thereof.

As best shown in FIGS. 6 and 7, a lower region of each load fence 302 may include a ceiling portion 600 and a ridge portion 602 protruding below the ceiling portion 600 (e.g., toward the test plate 102). In one embodiment, distance to which the ridge portion 602 protrudes below the ceiling portion 600 may be greater than, equal to, or less than the thickness dimension of the component 510. In another embodiment, distance to which the ridge portion 602 protrudes below the ceiling portion 600 may be greater than, equal to, or less than the distance to which the loading wall 502 protrudes above the surface-loading region 402. The ceiling portion 600 and ridge portion 602 are configured such that, when the test plate 102 is mounted on the component handler 100, the ceiling portion 600 is brought closely adjacent to the terminal surface 504 of the projections 400 of a corresponding component-seating track 104 (e.g., to within a distance less than or equal to the thickness dimension of the component 510). Likewise, the ridge portion 602 is brought to extend below the terminal surface 504 to be closely adjacent to the projections 400 of the corresponding component-seating track 104 (e.g., brought closely adjacent to a radially outer wall such as wall 700 opposite the loading wall 502, as shown in FIG. 7, of the projections 400 so as to be spaced apart from the radially outer wall 700 by a distance less than or equal to the any of the length, width or thickness dimensions of the component 510). Further, the ridge portion 602 is brought to extend below the terminal surface 504 to be closely adjacent to the surface of the body portion 200 adjacent to the radially outer wall 700 such that the distance between the ridge portion 602 and the surface of the body portion 200 adjacent to the radially outer wall 700 is less than the thickness dimension of the component 510. As best shown in FIG. 8, the component-seating chamber (e.g., component-seating chamber 800) is the space or volume generally defined or encompassed by the seating surface region 508 and seating walls 506 associated with a component-seating site 500, along with the ceiling portion 600 and ridge portion 602. As further shown in FIG. 8, the ridge portion 602 defines the radial extent of the component-seating sites 500.

With reference again to FIGS. 4, 4A, 4B, 4C, 6, and 8, in the illustrated embodiment, a component 510 that has been fed into the load frame 114 is captured within a component-seating chamber 800 by rotating the test plate 102 in the direction R. As the test plate 102 is rotated the component 510 tumbles, due to gravity, in a direction opposite to direction R, along a loading surface region (e.g., the labeled loading surface region 402). Depending on the location of the component 510 within the component-loading region 106, the component 510 may also tumble along the loading walls 502 of the projections 400 in a component-seating track 104. As the component 510 tumbles, the orientation of the component 510 relative to the component-seating chamber 800 may change until the component 510 becomes suitably aligned with the component-seating chamber 800. Upon becoming suitably aligned with the component-seating chamber 800, the component 510 (e.g., due to gravity) slides in a radially outward direction from loading surface region 402 into a component-seating chamber 800 located beneath a load fence 302 and between a pair of projections 400. In the illustrated embodiment, the component 510 is "suitably aligned" when the length-width face 522 of the component 510 (e.g., a surface region having external edges generally defined by the length- and width-dimensions thereof) lies on labeled loading surface region 402 and the length-wise axis of the component 510 is oriented substantially radially relative to center C. It will be appreciated, however, that one or more of the structures defining the component-seating chamber 800 may be configured in any suitable matter to capture components 510 having a different orientation or a range of different or similar orientations.

Figure 5A:
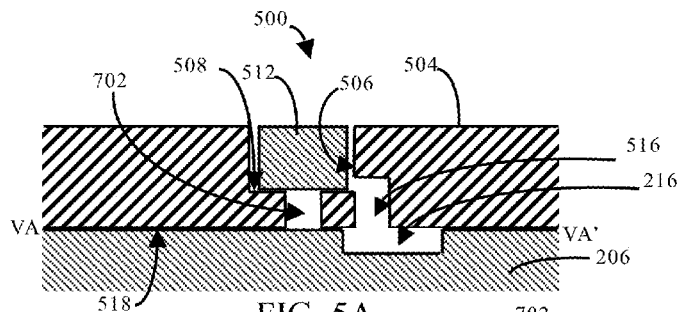
FIG. 5A is a cross-sectional view schematically illustrating a portion of the test plate shown in FIG. 5, taken along line VA-VA', illustrating a component-retention mechanism according to one embodiment.
Figure 5B:
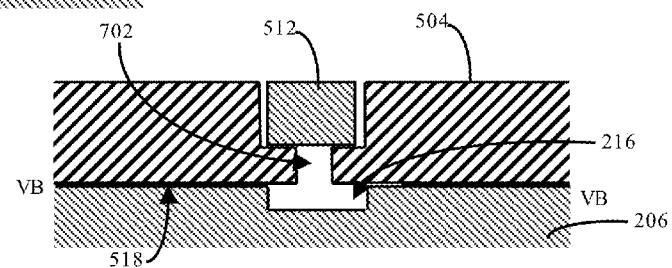
FIG. 5B is a cross-sectional view schematically illustrating a portion of the test plate shown in FIG. 5, taken along line VB-VB or VA-VA', illustrating a component-retention mechanism according to another embodiment.
Figure 5C:
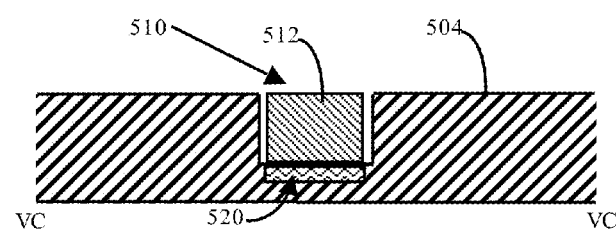
FIG. 5C is a cross-sectional view schematically illustrating a portion of the test plate shown in FIG. 5, taken along line VC-VC or VB-VB, illustrating a component-retention mechanism according to yet another embodiment.

FIG. 5A is a cross-sectional view schematically illustrating a portion of the test plate 102 shown in FIG. 5, taken along line VA-VA', illustrating a component retention mechanism according to one embodiment. FIG. 5B is a cross-sectional view schematically illustrating a portion of the test plate 102 shown in FIG. 5, taken along line VB-VB or VA-VA', illustrating a component retention mechanism according to another embodiment. FIG. 5C is a cross-sectional view schematically illustrating a portion of the test plate shown in FIG. 5, taken along line VC-VC or VB-VB, illustrating a component retention mechanism according to yet another embodiment.

As mentioned above, components 510 are retainable at respective ones of the component-seating sites 500. Components 510 may be retained at a component-seating site 500 by applying a suction force to the component 510, by applying a magnetic field to the component 510 (e.g., where the component contains a magnetic material), by applying an electro-static field to the component 510, by applying a physical pressure to the component 510, or the like or a combination thereof.

Referring to FIG. 5A, a vacuum transmission passage such as vacuum transmission passage 516 may be provided within the test plate 102 to transmit a suction force from a vacuum channel 216 to a component 510 located at a component-seating site 500, thereby retaining (or facilitating retention of) the component 510 at the component-seating site 500. The vacuum transmission passage 516 extends from a bottom surface 518 (also referred to herein as a "second surface") of the body portion 200 and into a projection 400 such that a vacuum transmission outlet of the vacuum transmission passage 516 intersects (i.e., is formed within) the seating wall 506 of a corresponding component-seating site 500.

In the embodiment exemplarily shown in FIGS. 5 and 5A, a vacuum transmission inlet of the vacuum transmission passage 516 is circumferentially offset and radially offset (e.g., radially inwardly, toward center C, as illustrated; or radially outwardly, away from center C) from a seating site inlet of the passage 702 (e.g., intersecting, or formed within, the bottom surface 518 of body portion 200) so as to intersect the bottom surface 518 of the body portion 200 at a location corresponding to the radial location of a vacuum channel 216 formed in the support surface 214. As shown in FIG. 5A, the vacuum channel 216 is formed in the support surface 214 at a location that is radially offset from the location where the seating site inlet of passage 702 intersects the bottom surface 518 of the body portion 200. Although FIG. 5A illustrates only one vacuum transmission passage 516 opening into a seating wall 506 of a component-seating site 500, it will be appreciated that any number of vacuum transmission passages 516, configured in any shape and/or size, may open into the same seating wall 506, into opposing seating walls 506 associated with the same component-seating site 500, or the like or a combination thereof.

Referring to FIG. 5B, a component 510 may be retained at a component-seating site 500 without the aforementioned vacuum transmission passage 516. Rather, in the illustrated embodiment, the passage 702 may transmit a suction force from a vacuum channel 216 to a component 510 located at a component-seating site 500, thereby retaining (or facilitating retention of) the component 510 at the component site 500. As shown in FIG. 5B, the vacuum channel 216 is formed in the support surface 214 at a location that is radially aligned with the location where the seating site inlet of passage 702 intersects the bottom surface 518 of the body portion 200. Although FIG. 5B illustrates an embodiment in which no vacuum transmission passages 516 are additionally provided to facilitate retention of the component 510 at the component-seating site 500, it will be appreciated that one or more of the aforementioned vacuum transmission passages 516 may also be provided at the component-seating site 500 as discussed above.

Referring to FIG. 5C, a component 510 may be retained at a component site 500 without any of the aforementioned passages 516 or 702. Rather, in the illustrated embodiment, the test plate 102 may include a magnet 520 disposed at or near the seating surface region 508 of a component-seating site 500 such that a magnetic field (not shown) generated by the magnet 520 is transmittable to at least a portion of the component 510. Thus, the component 510 can be retained at a component-seating site 500 by a magnetic field generated by the magnet 520. The magnet 520 may be a permanent magnet or an electromagnet (e.g., coupled to an electric current source internal to, or external from, the test plate 102, not shown. In the embodiment exemplarily shown in FIGS. 5 and 5C, the magnet 520 is radially offset (e.g., radially outwardly, away from center C) from the passage 702. Although FIG. 5C illustrates only one magnet 520 at a component-seating site 500, it will be appreciated that any number of magnets 520, configured in any shape and/or size, may be disposed in the seating surface region 508, in one or more seating wall 506, or the like or a combination thereof, of a particular component-seating site 500. For example, magnets 520 may be disposed both radially inward and radially outward of the passage 702. Further, one or more passages such as passages 516 and 702, or the like, may additionally be provided to facilitate retention of the component 510 at the component-seating site 500.

In the embodiments shown in FIGS. 5A to 5C, the top face 522 of the component 510 is coplanar with the terminal surface 504 of adjacent projections 400. In other embodiments, however, the top face 522 of components 510 handed by the component handler 100, described according to any embodiment provided herein, may lie above the terminal surface 504 of an adjacent projection, or may lie below the terminal surface 504 of an adjacent projection.

Figure 9:
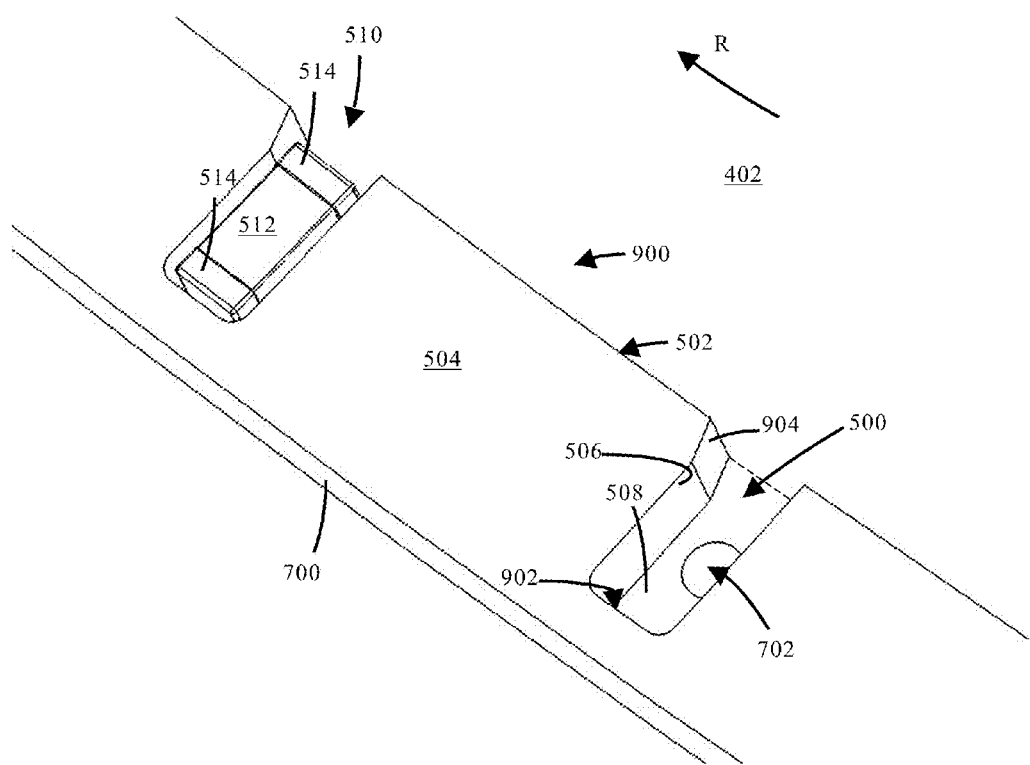
FIG. 9 is an enlarged perspective view schematically illustrating a portion of component-seating tracks according to another embodiment.
Figure 10:
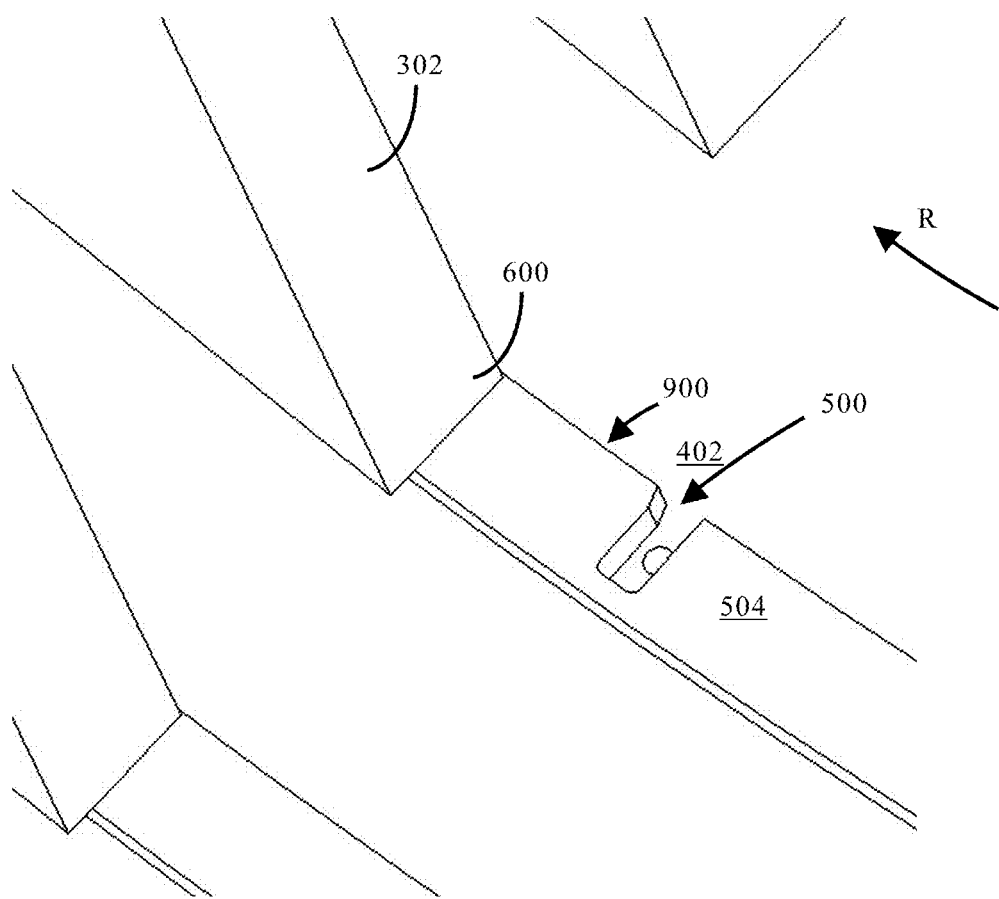
FIG. 10 is an enlarged perspective view schematically illustrating load fences according to another embodiment, and the loading of components at respective component-seating sites defined by the component-seating tracks shown in FIG. 9.
Figure 11:
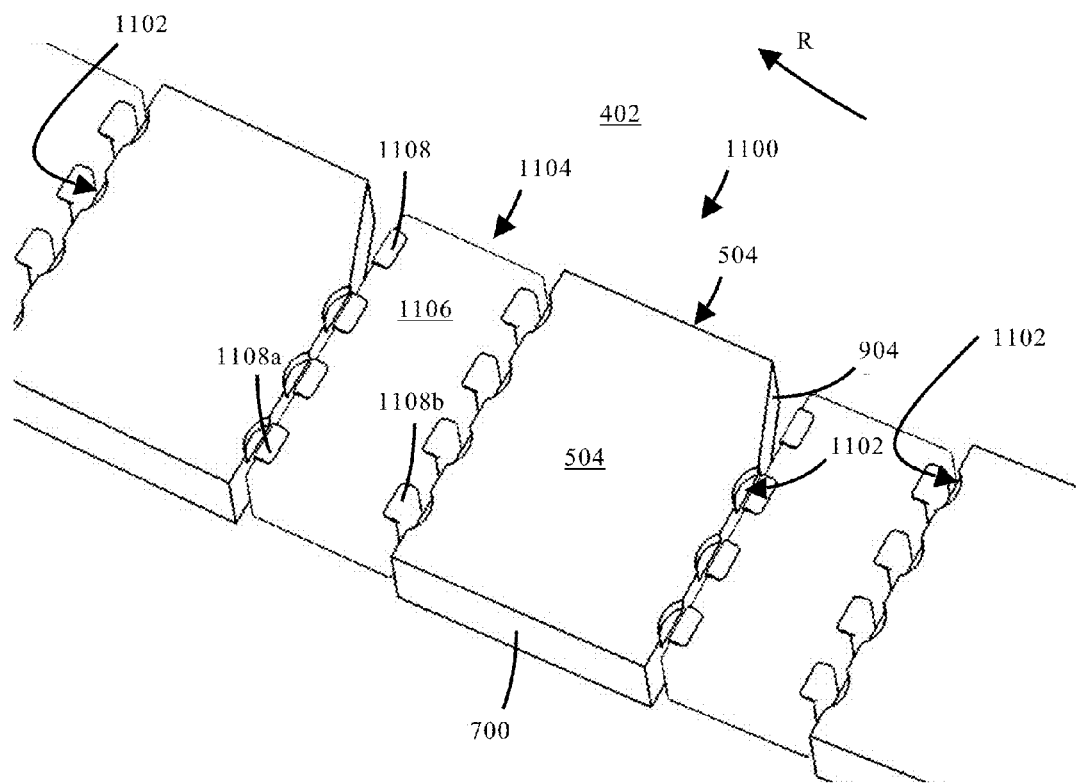
FIG. 11 is an enlarged perspective view schematically illustrating a portion of a component-seating track according to yet another embodiment.

FIG. 9 is an enlarged perspective view schematically illustrating a portion of component-seating tracks 104 according to another embodiment. FIG. 10 is an enlarged perspective view schematically illustrating load fences 302 according to another embodiment, and the loading of components 510 at respective component-seating sites 500 defined by the component-seating tracks 104 shown in FIG. 9. FIG. 11 is an enlarged perspective view schematically illustrating a portion of a component-seating track 104 according to yet another embodiment.

Although the component-seating tracks 104 have been described above as including projections such as projections 400, it will be appreciated that one or more of the component-seating tracks 104, or a portion of any of these, may be differently configured. For example, and with reference to FIG. 9, a component-seating track 104 according to another embodiment may include a projection 900 extending from the body portion 200 and having a notch formed therein. Similar to the projections 400, the projection 900 may include a loading wall 502, a radially outer wall 700 opposite the loading wall 502 and a terminal surface 504. In the illustrated embodiment, the notch extends from the loading wall 502 along a radially outward direction toward the radially outer wall 700 to define the aforementioned seating walls 506 and additional seating wall 902 (e.g., an "auxiliary seating wall") that is spaced apart from the radially outer wall 700. Each seating wall 506 defines the circumferential extent of a portion of a component-seating site 500. The auxiliary seating wall 902 defines the radial extent of the component-seating site 500.

Although the projection 900 is illustrated as including two notches, it will be appreciated that the projection 900 may include more than two notches, or may only contain one notch. In embodiments where a component-seating track 104 includes a single projection 900, the projection 900 may extend completely circumferentially around center C, or may extend only partially around. In embodiments where a component-seating track 104 includes a multiple, spaced apart projections 900, the projections 900 may generally be aligned relative to one another in the manner discussed above with respect to the projections 400.

Upon providing a component-seating track 104 as exemplarily described above with respect to FIG. 9, a load fence 302 corresponding to the component-seating track 104 may be provided in the same manner as discussed above with respect to FIGS. 3, 4, 6, 7 and 8, or may be configured differently. For example, and with reference to FIG. 10, a lower region of each load fence 302 may simply include the aforementioned ceiling portion 600, but omit the ridge portion 602.

In one embodiment a leading edge of the notch at the loading wall 502 (e.g., as determined according to the direction of rotation indicated by arrow R) may include a beveled or chamfered wall 904 (e.g., a "capture wall") configured to facilitate capture of components 510 having a wider range of orientations than might be permitted by the projections configured as described above with respect to FIGS. 3, 4, 5 and 7. It will be appreciated, however, that one or more of the projections 400 may also include a capture wall 904 as illustrated in FIG. 9.

Referring to FIG. 11, a component-seating track 104 according to yet another embodiment may include spaced-apart projections such as projections 1100 which, similar to projections 400, each extend from the body portion 200 and include the aforementioned loading wall 502, terminal surface 504, and seating walls 506. Similar to the projections 400, a component-seating site 500 is located within the space between each pair of adjacent projections 1100. Further, the leading seating wall 506 associated with each component-seating site 500 may include the aforementioned capture wall 904. The leading seating wall 506 may be considered to be the seating wall 506 that is closest to the components 510 as they travel downward pulled by gravity and as the test plate travels upward, such as in direction R.

In the illustrated embodiment, the projection 1100 may include one or more probe recesses 1102 arranged within the terminal surface 504 and seating wall 506 of a projection 1100 so as to be adjacent to lateral terminations 1108 of a component, such as component 1104, located at a component-seating site defined by the seating wall 506. Each probe recess 1102 may, for example, extend from a terminal surface 504 and adjoining seating wall 506 of a projection 1100 to provide more room for a probe of a test module to touch the lateral terminations 1108 of the component 1104 at the component-testing region 108.

As exemplarily illustrated, the component 1104 is a four-element MLCC chip array, and includes a body 1106 generally defining the length, width and thickness dimensions of the component 1104, and four pairs of plated terminations (e.g., electrodes, terminals, etc.) 1108 disposed at along the length dimension of the component 1104, wherein, terminations 1108 in each pair (e.g., terminations 1108*a* and 1108*b*) are disposed at opposite sides of the component body 1106, wherein the opposite sides are separated by the width dimension of the component 1104. As with previously-described embodiments, it will be appreciated that any of the components 1104 may alternatively be provided as a singular MLCC, a two-element MLCC chip array, a light-emitting diode (LED), a chip-scale package (CSP), or the like.

Although FIG. 11 illustrates a plurality of probe recesses 1102 extending from a common seating wall 506, wherein the location of each probe recess 1102 corresponds to the location of a corresponding termination 1108 on an adjacent component 1104, it will be appreciated that any recess 1102 may be sized to extend adjacent to multiple terminations 1108. Moreover, any of the aforementioned component-seating sites 500 may be accessorized with probe recesses 1102. It will also be appreciated that the projections 1100 may be structured in any other suitable or beneficial manner to facilitate contact of a probe to a termination 1108 of the component 1104.

Figure 12:
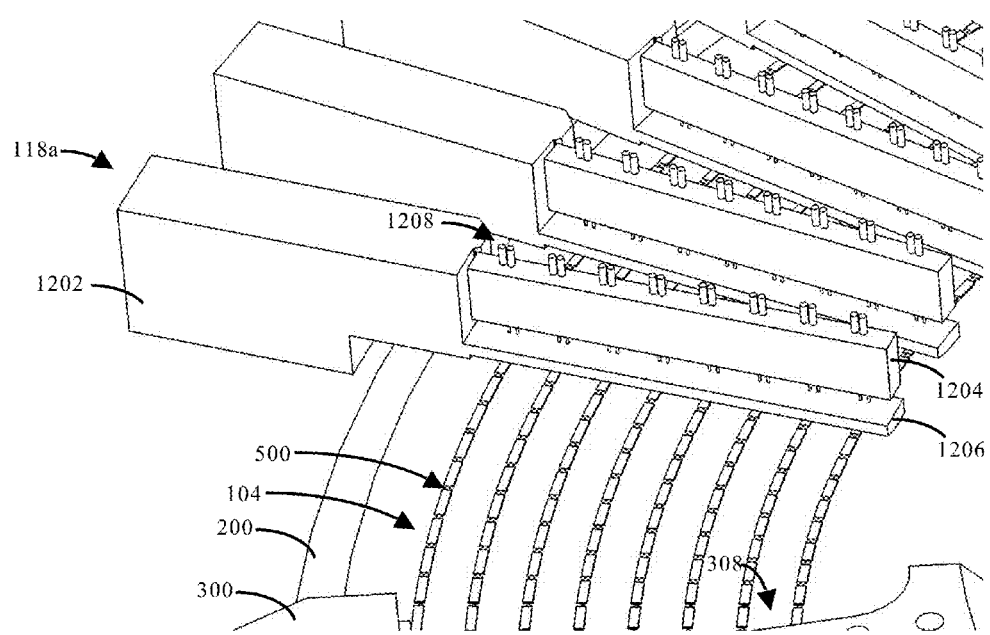
FIG. 12 is an enlarged perspective view schematically illustrating one embodiment of test module assemblies within a portion of the component-testing region of the component handler shown in FIG. 1.
Figure 13:
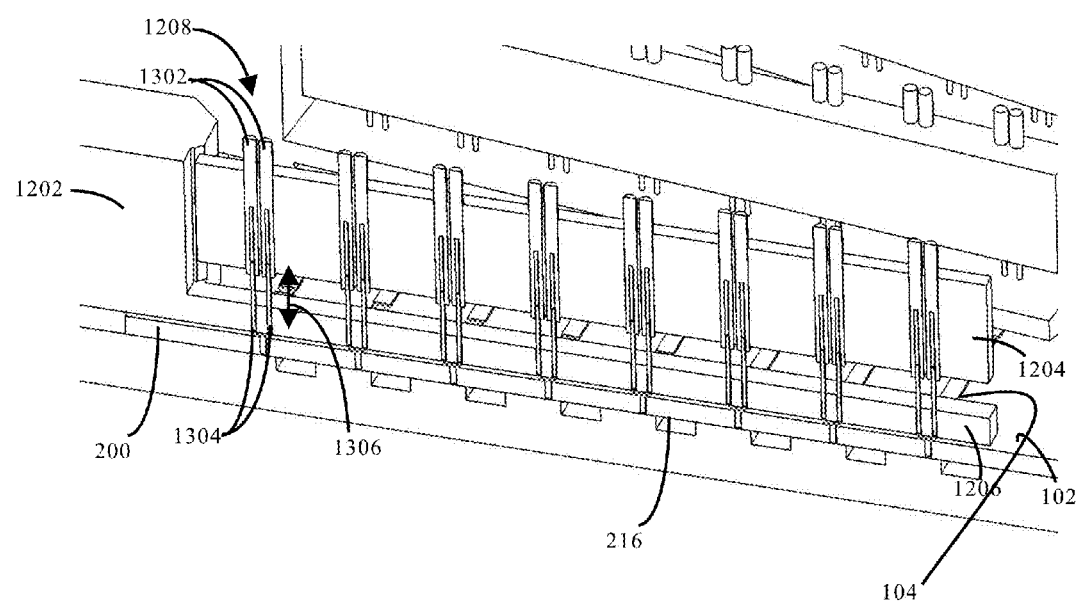
FIG. 13 is a cross-sectional view schematically illustrating a test module assembly shown in FIG. 12.
Figure 14:
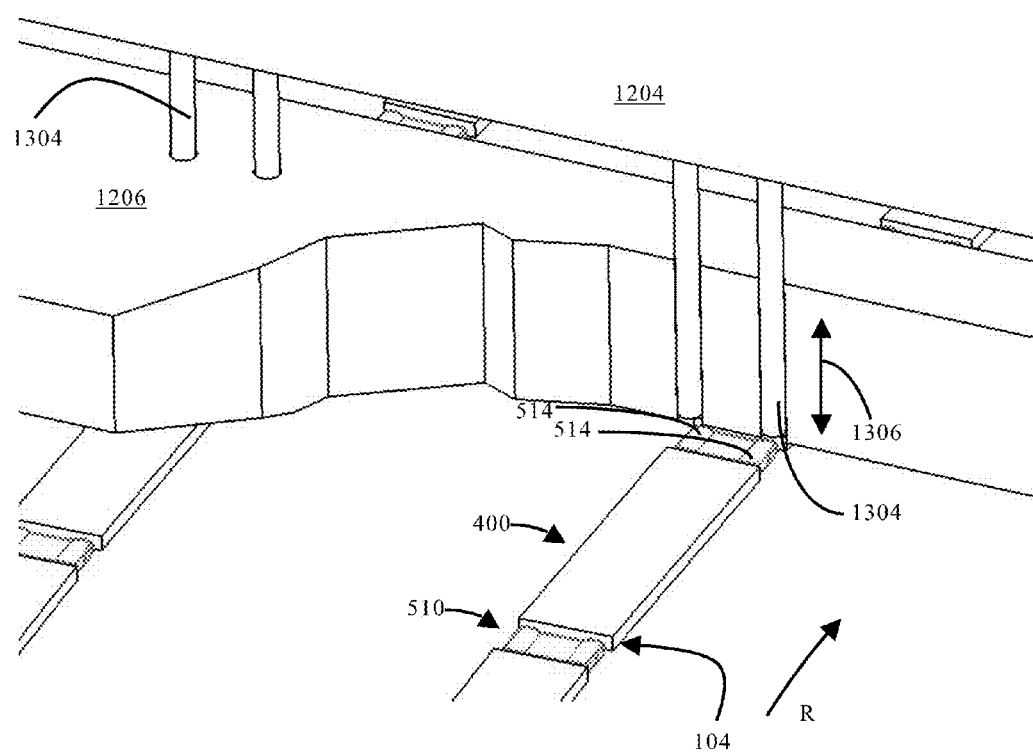
FIG. 14 is an enlarged perspective view schematically illustrating the alignment of test probes of a test module shown in FIG. 13 with electrodes of a component located within the component-testing region.

FIG. 12 is an enlarged perspective view schematically illustrating one embodiment of a test module assembly 118 within a portion of the component-testing region 108 of the component handler 100 shown in FIG. 1. FIG. 13 is a cross-sectional view schematically illustrating the test module assembly 118 shown in FIG. 12. FIG. 14 is an enlarged perspective view schematically illustrating the alignment of test probes of the test module assembly 118 shown in FIG. 13 with terminations 514 of a component 510 located within the component-testing region 108.

Referring to FIGS. 12 and 13, a test module assembly 118 such as the aforementioned first test module assembly 118a may be positioned downstream (in the direction of rotation R of the test plate 102) of the entry feeding port 308 and may include a test module assembly support 1202, a test module support 1204, a probe guide 1206, and a plurality of test modules 1208.

The test module assembly support 1202 may be coupled to the component handler 100 and be configured to hold the test modules 1208 over the test plate 102 (e.g., so that, as the test plate 102 rotates, the test modules 1208 remain, at least substantially, stationary relative to the test plate 102). The test module assembly support 1202 may further be configured (e.g., with one or more parts such as screws, springs, bearings, rails, pegs, levers, clamps, or the like or a combination thereof) such that the position of the test modules 1208 can be adjusted radially (e.g., with respect to the center C), circumferentially (e.g., about the center C), axially (e.g., in a direction parallel to the axis of rotation, extending through center C), or the like or a combination thereof.

The test module support 1204 may be coupled to the test module assembly support 1202 and be configured to hold probe housings (e.g., probe housings 1302, as shown in FIG. 13) of each test module 1208 at a fixed or adjustable height over the test plate 102. The probe guide 1206 may be coupled to the test module assembly support 1202 (as illustrated), or may be coupled to the test module support 1204, or a combination thereof. The probe guide 1206 is configured to facilitate precise placement of tips of the test probes (e.g., test probes 1304, as shown in FIG. 13) onto terminations 514 of components 510 retained at component-seating sites 500 of a component-seating track 104.

As exemplarily shown in FIGS. 13 and 14, each test module 1208 includes a pair of probe housings 1302, each configured to receive a corresponding test probe 1304 within an interior thereof. Further, a spring may further be provided to bias a test probe 1304 toward the test plate 102, relative to a corresponding probe housing 1302. Accordingly, the test probes 1304 are movable relative to the probe housings 1302 along the directions by arrow 1306. Each probe housing 1302 may be formed of an electrically conductive material and be configured to contact the test probe 1304. Further, each probe housing 1302 may be connected to wires, a circuit board, or the like, to transmit electric current, voltage, signals, etc., from a corresponding test probe 1304 to a voltage source (not shown), signal processor (not shown), or the like, or a combination thereof.

In the illustrated embodiment, the number and arrangement of probe housings 1302 and test probes 1304 in a test module 1208 may correspond to the number and arrangement of terminations 514 on a component 510 retained at a component-seating site 500 of a component-seating track 104. In the illustrated embodiment, the number of test probes 1304 in one or more test modules 1208 of a test module assembly 118 may be equal to the number of terminations 514 on a component having a component characteristic to sense, detect, measure or the like. In another embodiment, however, the number of test probes 1304 in one or more test modules 1208 of a test module assembly 118 may be less than the number of terminations 514 on the component 510.

Figure 15:
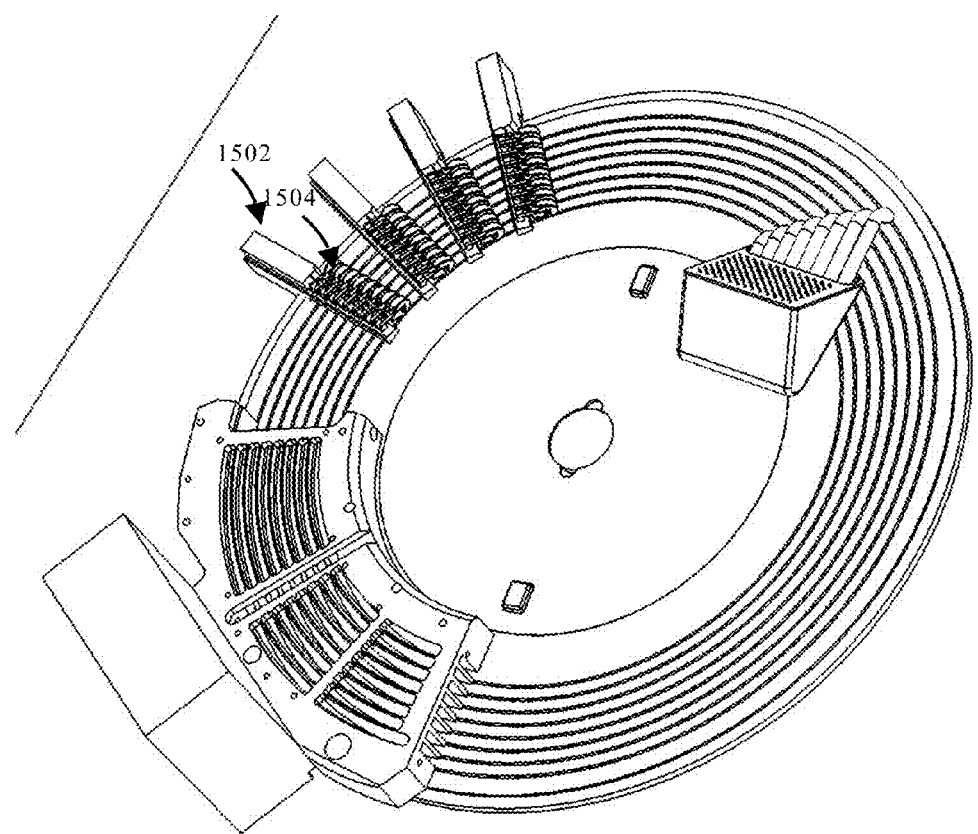
FIG. 15 is a perspective view schematically illustrating another embodiment of a test module assembly.
Figure 16:
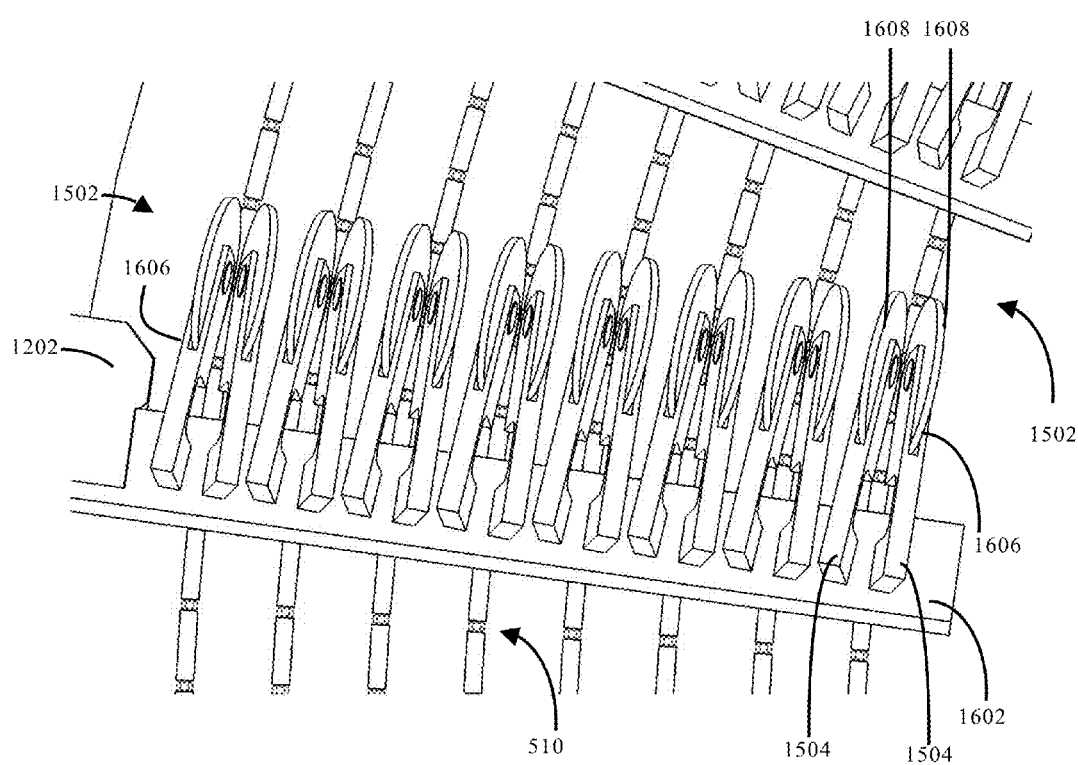
FIG. 16 is a top plan view schematically illustrating a test module assembly shown in FIG. 15.

FIG. 15 is a perspective view schematically illustrating another embodiment of a test module assembly 118. FIG. 16 is a top plan view schematically illustrating the test module assembly 118 shown in FIG. 15.

Although the test module assemblies 118 have been described above as including the test modules 1208, it will be appreciated that one or more or all of the test modules of any of the test module assemblies 118 may be differently configured. In a broad sense, the test probes 1304 may be provided as any suitable or beneficial type of test probe 1304 (e.g., as sliding contact probes, rolling contact probes, actuated contact probes, or the like or a combination thereof). Further, in one example, the test module assembly 118 and test modules 1208 may be provided as exemplarily described in U.S. Pat. No. 5,842,597. In another example, with reference to FIGS. 15 and 16, a test module assembly such as test module assembly 1502 may include a plurality of test modules such as test module 1504.

As best shown in FIG. 16, the test module assembly 1502 includes the aforementioned test module assembly support 1202, a test module support 1602 coupled to the test module assembly support 1202, and a plurality of test modules 1504. Each test module 1504 includes a pair of contact supports 1606 and a test probe 1608 (e.g., a roller contact) rotatably coupled to each contact support 1606. Further, each contact support 1606 may be connected to wires, a circuit board, or the like, to transmit electric current, voltage, signals, etc., from a corresponding test probe 1608 to a voltage source (not shown), signal processor (not shown), or the like, or a combination thereof.

In the illustrated embodiment, the number and arrangement of contact supports 1606 and test probes 1608 in a test module 1504 may correspond to the number and arrangement of terminations 514 on a component 510 retained at a component-seating site 500 of a component-seating track 104. In the illustrated embodiment, the number of test probes 1608 in one or more test modules 1504 of a test module assembly 1502 may be equal to the number of terminations 514 on a component 510 having a component characteristic to sense, detect, measure, or the like. In another embodiment, however, the number of test probes 1608 in one or more test modules 1504 of a test module assembly 1502 may be less than the number of terminations 514 on the component 510.

In the illustrated embodiment, each of the test probes 1608 in a test module is rotatable about an axis that is oblique with respect to the reference plane 112. In another embodiment, however, one or more or all of the test probes 1608 within a test module 1502 are rotatable about an axis that is parallel with respect to the reference plane 112. In the illustrated embodiment, the test probes 1608 of a common test module 1502 are rotatable about axes that are non-parallel (e.g., oblique or orthogonal) with respect to each other. In another embodiment, however, one or more or all of the test probes 1608 of a common test module 1502 are rotatable about axes that are parallel with respect to each other.

In the embodiments described above with respect to FIGS. 5 to 16, the components 510 are retained at component-seating sites 500 such that terminations 514 (e.g., electrodes, terminals, etc.) of the components 510 to be contacted by test probes 1304 or 1608 are disposed at the top or upper faces 522 of the retained components 510. However, depending upon factors such as the configuration of the test plate 102, the configuration of the projections 400, 900, or 110 on the test plate 102 and the size and geometry of the components 510 or 1104 to be handled by the component handler 100, the terminations 514 or 1108 to be contacted by any test probe 1304 or 1608 may be disposed on an end face of a component 510, on a side face of a component, or the like, or a combination thereof. For example, in embodiments where a termination 514 or 1108 of a component 510 is located at a radially inner or outer end face thereof, a test module 1504 may include a test probe 1608 such as a roller contact that is rotatable about an axis that is perpendicular (or oblique) to the reference place 112, or may include a sliding or actuated contact, or the like or a combination thereof.

Figure 17:
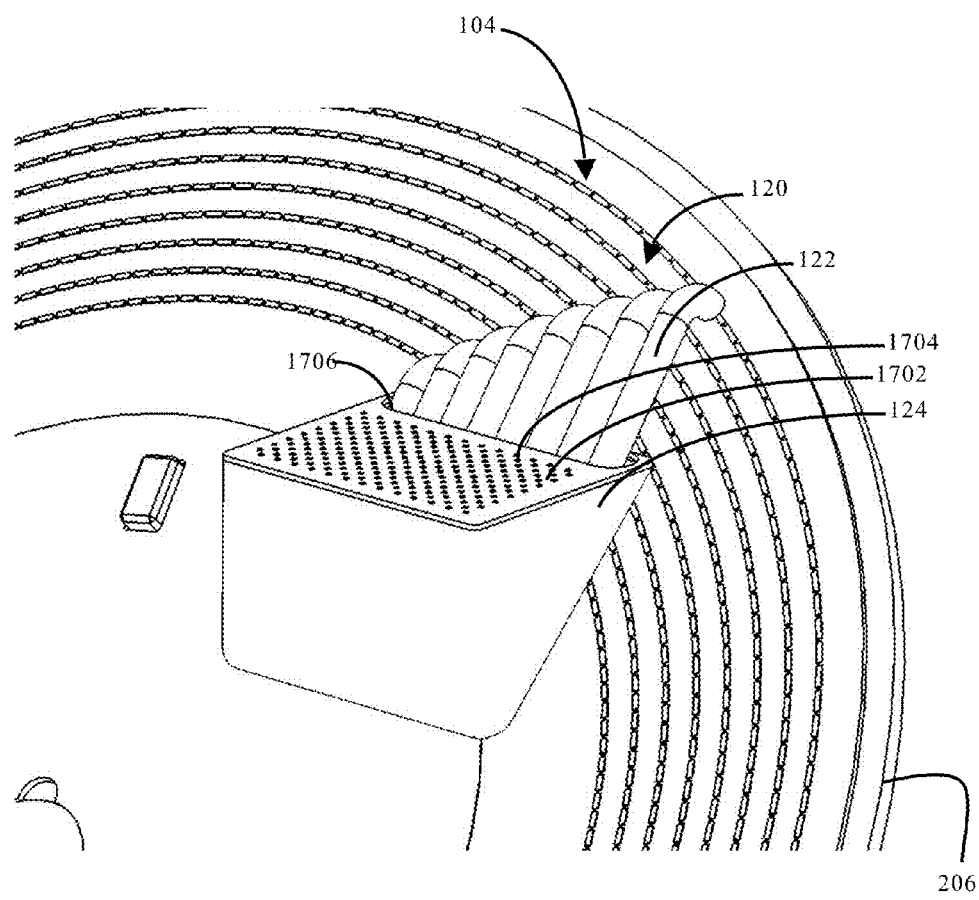
FIG. 17 is an enlarged perspective view schematically illustrating one embodiment of a collection assembly within a portion of the component-ejection region of the component handler shown in FIG. 1.
Figure 18:
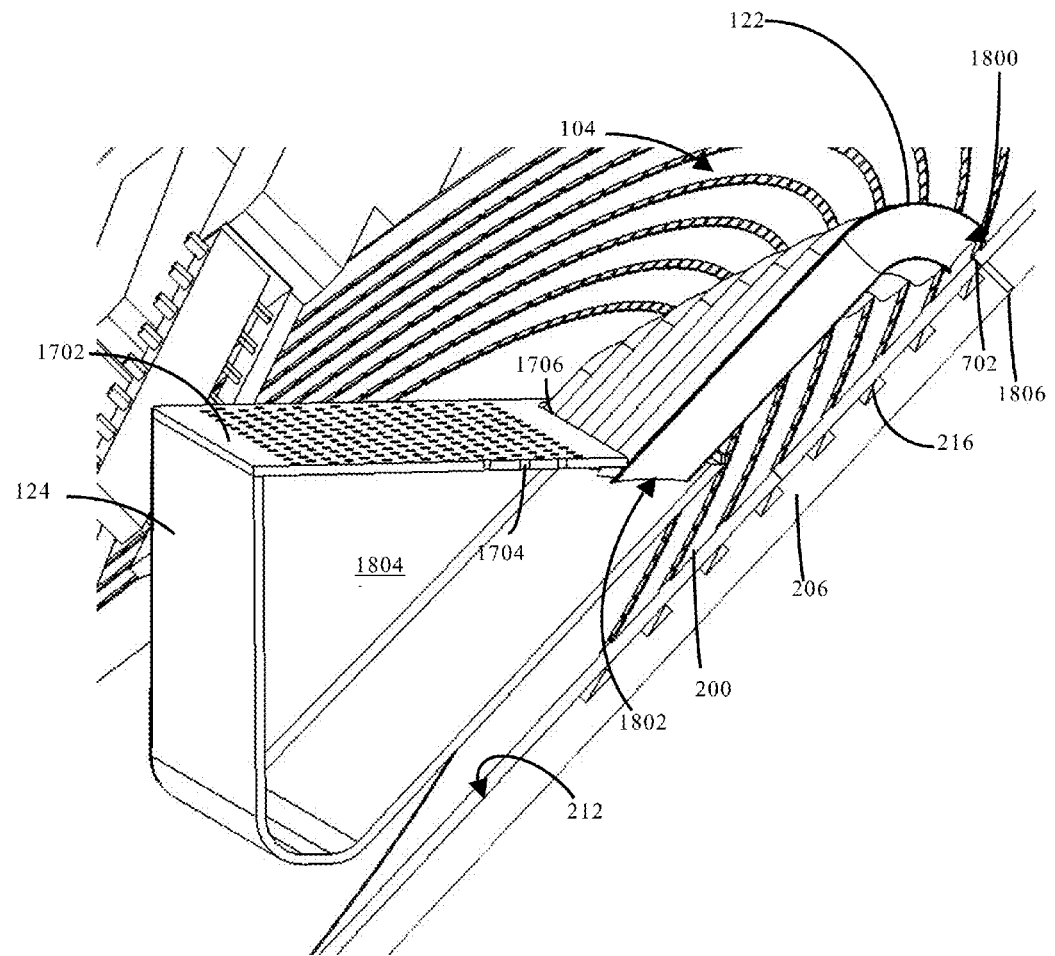
FIG. 18 is a cross-sectional view schematically illustrating the collection assembly shown in FIG. 17, as well as a portion of the test plate and test plate support within a portion of the component-ejection region shown in FIG. 1.

FIG. 17 is an enlarged perspective view schematically illustrating one embodiment of a collection assembly 120 within a portion of the component-ejection region 110 of the component handler 100 shown in FIG. 1. FIG. 18 is a cross-sectional view schematically illustrating the collection assembly 120 shown in FIG. 17, as well as a portion of the test plate 102 and vacuum plate 206 within a portion of the component-ejection region 110 shown in FIG. 1.

Referring to FIGS. 17 and 18, the collection assembly 120 described above with respect to FIGS. 1 and 2 is includes a plurality of collection tubes 122 and a collection bin 124. As best shown in FIG. 18, each collection tube 122 may include a first end 1800 and a second end 1802. The first end 1800 is located over a corresponding component-seating track 104 at a location corresponding to a component-ejection site (not shown) of the component handler 100. The second end 1804 is in fluid communication with an interior 1804 of the collection bin 124. Each collection tube 122 is configured to receive, at the first end 1800 thereof, a component 510 ejected from the test plate 102 and guide the received component 510 through the second end 1802 and into the collection bin 124.

In the illustrated embodiment, the collection assembly 120 may further include a bin plate 1702. The bin plate 1702 may include a plurality of ventilation holes 1704 extending therethrough and a common aperture 1706 configured to receive the plurality of collection tubes 122. The bin plate 1702 may be coupled to the collection bin 124, to one or more of the collection tubes 122, or the like, or a combination thereof.

The component handler 100 may include one or more ejection mechanisms configured to eject one or more components 510 or 1104 from the test plate 102. In the embodiment illustrated in FIG. 18, an ejection mechanism may be provided as an ejection nozzle, such as ejection nozzle 1806, formed within the test plate support 206. In the illustrated embodiment, a discharge outlet of the ejection nozzle 1806 intersects (i.e., is formed within) the support surface 214 at a location defining a component-ejection site of the component handler 100 (e.g., in registration with the first end 1800 of a collection tube 122). Thus, the discharge outlet of the ejection nozzle 1806 intersects the support surface 214 at a location radially corresponding to a location of a passage 702 formed within the test plate 102. The area of the discharge outlet may be greater than, equal to, or less than the area of the seating site inlet of passage 702. Although FIG. 18 illustrates only one ejection nozzle 1806, it will be appreciated that multiple ejection nozzles 1806 may be formed within the test plate support 206 in registration with corresponding ones of first ends 1800 of other collection tubes 122. In the illustrated embodiment, the ejection nozzle 1806 is isolated from the vacuum channels 216, and extends through the test plate support 206.

Each ejection nozzle 1806 is configured to be in fluid communication with a high-pressure source (not shown). When, during operation of the component handler 100, a particular component-seating site is moved or indexed to be in operable proximity with a component-ejection site, the passage 702 associated with the particular component-seating site is placed in fluid communication with the ejection nozzle 1806. A fluid (e.g., pressurized air) can be then transmitted from the high-pressure source, sequentially through the ejection nozzle 1806 and passage 702, to dislodge a retained component from the particular component-seating site and eject the dislodged component from the test plate 102 (e.g., into the first end 1800 of a corresponding collection tube 122). In one embodiment, characteristics of the flow of the fluid (e.g., volume, velocity, area, pressure, or the like, or a combination thereof) from the discharge outlet such that the fluid can enter into the passage 702 with a force sufficient to overcome the suction force applied to the component from a vacuum channel 216, thereby efficiently dislodging the component from the component-seating site 500 and ejecting the dislodged component 510 from the test plate 102 without having to reduce the suction force applied to the component by the vacuum channel 216.

In one embodiment, the component handler 100 may further include one or more pneumatic valves, as discussed in U.S. Pat. No. 5,842,579, configured to control the flow of fluid from the high-pressure source into one or more corresponding ones of the ejection nozzles 1806. The pneumatic valves may be selectively actuatable to ensure that components 510 having the same or similar values of sensed, detected, or measured component characteristics are ejected from the test plate 102 and into collection tubes 122 associated with the same collection bin 124.

Figure 19:
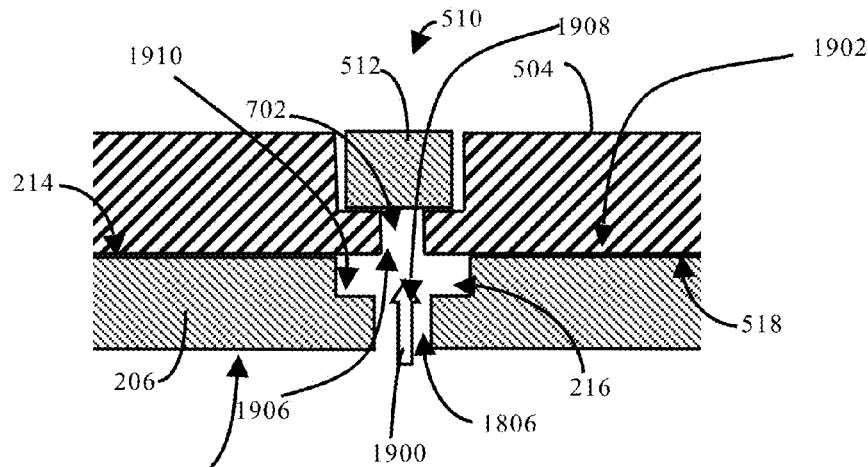
FIGS. 19, 20, and 21 are cross-sectional views schematically illustrating some embodiments of an ejection mechanism for ejecting a component from a component-seating site of the test plate.
Figure 20:
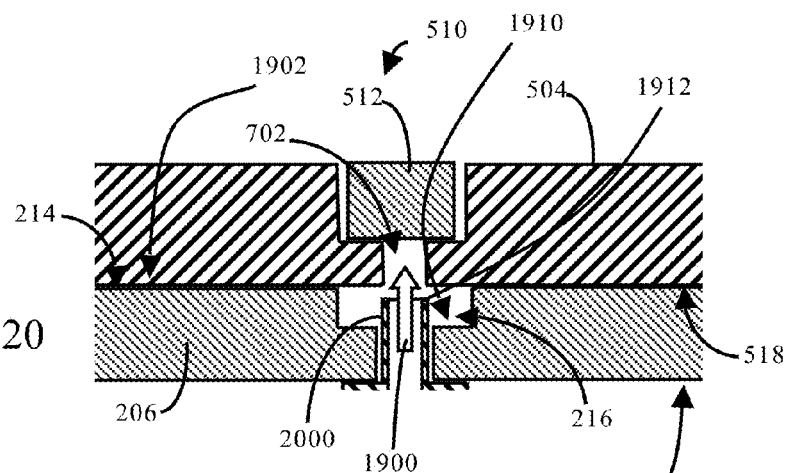
Figure 21:
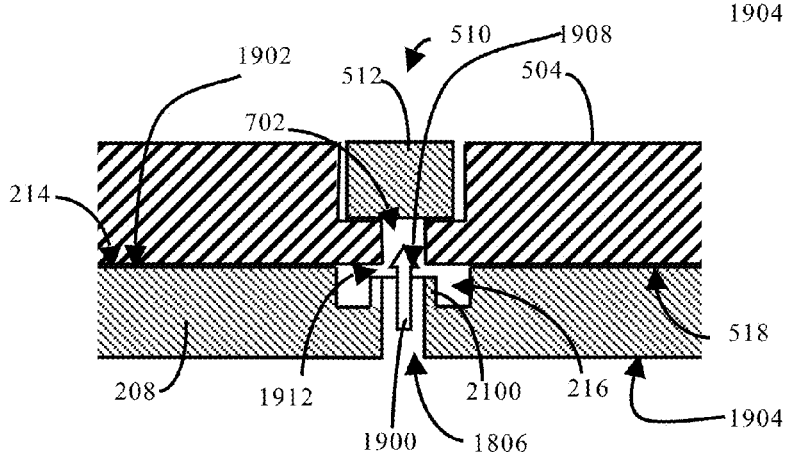

FIGS. 19, 20, and 21 are cross-sectional views schematically illustrating some embodiments of an ejection mechanism for ejecting a component 510 from a component-seating site of the test plate.

Although the ejection mechanism has been described above as including an ejection nozzle 1806 which is isolated from the vacuum channels 216, it will be appreciated that one or more or all of the ejection mechanisms of the component handler 100 may be differently configured. For example, and with reference to FIG. 19, the ejection nozzle 1806 may be in fluid communication with a vacuum channel 216. In the illustrated embodiment, the discharge outlet of the ejection nozzle 1806 intersects a surface defining the vacuum channel 216. Fluid (e.g., pressurized air) received within the ejection nozzle 1806 may be discharged from the discharge outlet thereof (e.g., along the direction indicated by arrow 1900), through the vacuum channel 216 and into the passage 702.

In another example, and with reference to FIG. 20, the ejection mechanism may further include an auxiliary ejection nozzle 2000 coupled to the high-pressure source (e.g., either directly or indirectly, for example, via one or more pneumatic valves) and to the test plate support 206 so as to extend through the ejection nozzle 1806 and into the vacuum channel 216. A discharge outlet of the auxiliary ejection nozzle 2000 may thus be located closer to the seating site inlet 1906 of passage 702 than the discharge outlet 1908 of the ejection nozzle 1806 to enhance the efficiency with which the fluid is transmitted into the passage 702 to dislodge the component 510 from a component-seating site and ultimately eject the dislodged component 510 from the test plate 102.

In yet another example, and with reference to FIG. 21, the ejection nozzle 1806 may further include a projection 2100 extending from a recessed surface 1910 defining the vacuum channel 216, toward the support surface 214. The projection 2100 may thus locate the discharge outlet 1908 of the ejection nozzle 1806 closer to the seating site inlet 1906 of passage 702 to enhance the efficiency with which the fluid is transmitted into the passage 702 to dislodge the component 510 from a component-seating site 500 and ultimately eject the dislodged component 510 from the test plate 102. Moreover, an upper end 1912 of the auxiliary ejection nozzle 2000 or the auxiliary ejection nozzle 2100 may be positioned closer to a top surface 1902 of the vacuum plate 206 (or closer to the seating site inlet 1906 of passage 702) than to a bottom surface 1904 of the vacuum plate 206. In some embodiments, the upper end of the of the auxiliary ejection nozzle 2000 or the auxiliary ejection nozzle 2100 may be positioned closer to a top surface 1902 of the vacuum plate 206 (or closer to the seating site inlet 1906 of passage 702) than to the recessed surface 1910 of the vacuum channel 216.

In one embodiment, the component handler 100 may further include one or more auxiliary vacuum nozzles (not shown), provided in a similar manner as the ejection nozzle 1806 or auxiliary ejection nozzle 2000 or 2100 as exemplarily described above with respect to FIGS. 19 to 21, but coupled to either the aforementioned low-pressure source or an auxiliary low-pressure source. The auxiliary vacuum nozzle may be disposed within the same vacuum channel 216 as the ejection nozzle 1806 or auxiliary ejection nozzle 2000 or 2100 described above with respect to FIGS. 19 to 21, such that the auxiliary vacuum transmission outlet of the auxiliary vacuum nozzle is near the discharge outlet of the ejection nozzle 1806 or auxiliary ejection nozzle 2000 or 2100. By auxiliary vacuum transmission outlet of the auxiliary vacuum nozzle to be near the discharge outlet of the ejection nozzle 1806 or auxiliary ejection nozzle 2000 or 2100, an adequate suction force can be sustainably applied to a component retained at a component-seating site 500 that is (for example) adjacent to another component-seating site from which a component 510 is being dislodged and ejected. Thus, the suction force that is applied to one or more components 510 transported to the component-ejection region 110 can be greater than the suction force that is applied to components 510 located outside the component-ejection region 110.

As exemplarily discussed in the embodiments above, components 510 may be ejected from the test plate 102 along an ejection trajectory that is, initially, orthogonal (or at least substantially orthogonal) to the reference plane 112. It will be appreciated, however, that in other embodiments the ejection nozzle 1806 (or auxiliary ejection nozzle 2000 or 2100), seating surface region 508, projections or the like or a combination thereof may be differently configured such that components 510 are ejected from the test plate 102 along an ejection trajectory that is, initially, not orthogonal (nor at least substantially orthogonal), but is oblique or parallel (or at least substantially parallel) with respect to the reference plane 112.

In such embodiments, the components may be ejected from the test plate 102 along an ejection trajectory that is, at least initially, extends radially inwardly (e.g., toward center C), radially outwardly (e.g., away from center C), or both, away from a component-seating site 500 (e.g., depending on the location of a component-ejection site within the component-ejection region 110, depending on how the ejection trajectory would relate to gravity, or the like or a combination thereof). In this case, the first ends 1800 of the collection tubes 122 (or an end of a collection manifold) may be located radially inboard or outboard of the component-seating sites 500 and the component 510 to be ejected. A radially opposed structure that includes a passageway for pressurized air may be in close proximity to a component 510 retained at a component-seating site 500. The seating site outlet of the passage 702 may then point at the retained component 510 and also generally point at the first end 1800 of a collection tube 122 (or collection manifold). Such an arrangement can simplify the structure of the test plate support 206 and/or the test plate 102 because neither of these structures would include features necessary to simultaneously retain components with a suction force while also introducing the pressurized air for ejection.

The foregoing is illustrative of embodiments of the invention and is not to be construed as limiting thereof. Although a few specific example embodiments have been described, those skilled in the art will readily appreciate that many modifications to the disclosed exemplary embodiments, as well as other embodiments, are possible without materially departing from the novel teachings and advantages of the invention. Accordingly, all such modifications are intended to be included within the scope of the invention as defined in the claims. For example, skilled persons will appreciate that the subject matter of any sentence or paragraph can be combined with subject matter of some or all of the other sentences or paragraphs, except where such combinations are mutually exclusive. It will be obvious to those having skill in the art that many changes may be made to the details of the above-described embodiments without departing from the underlying principles of the invention. The scope of the present invention should, therefore, be determined by the following claims, with equivalents of the claims to be included therein.

The invention claimed is:

1. A component handler comprising: a test plate including: a body portion having a first surface and a second surface that is opposite the first surface; a plurality of protrusions extending from the first surface of the body portion; and a plurality of component-seating sites, wherein each of the plurality of component-seating sites is disposed between a pair of adjacent protrusions and is configured to retain a component, wherein adjacent protrusions have seating walls that face each other on opposite sides of each component-seating site, wherein each protrusion has a protrusion surface between adjacent seating walls of different component-seating sites, wherein the test plate is movable such that the plurality of component-seating sites are conveyable along a component seat travel path, and wherein the test plate is inclined at a non-horizontal angle; and a component-receiving system for receiving a stream of components and seating them in the component-seating sites, the component-receiving system including a fence extending along a component seat travel path in a component-loading region, the fence having a ceiling portion operable to cover the protrusion surfaces and component-seating sites as they move beneath the fence, and wherein a distance between the ceiling portion of the fence and the protrusion surface of at least one of the plurality of protrusions is less than a thickness of the component retainable at one of the plurality of component-seating sites.

2. The component handler of claim 1, wherein the fence has an overhanging ridge that extends downward from the ceiling portion.

3. The component handler of claim 1, wherein the plurality of protrusions are integrally formed with the body portion.

4. The component handler of claim 1, wherein no protrusion of the plurality of protrusions overlaps with any component-seating site of the plurality of component-seating sites.

5. The component handler of claim 1, the plurality of protrusions are part of the test plate.

6. The component handler of claim 1, wherein the plurality of protrusions exist even when no components are retained at the plurality of component-seating sites.

7. The component handler of claim 1, wherein the plurality of protrusions are separately formed from, but attached to, the body portion.

8. The component handler of claim 7, further comprising an adhesive attaching the plurality of protrusions to the body portion.

9. A component handler comprising: a test plate including: a body portion having a first surface and a second surface that is opposite the first surface; and a plurality of component-seating sites, wherein each component-seating site has a seating surface region spaced apart from the second surface, wherein each seating surface region comprises a seating plane against which the component is retainable and a passageway intersecting the seating plane, wherein the test plate is movable such that the plurality of component-seating sites are conveyable along a component seat travel path, and wherein the test plate is inclined at a non-horizontal angle; a vacuum plate including: a vacuum plate support surface; a vacuum plate bottom surface; and a vacuum channel extending from the vacuum plate support surface toward the vacuum plate bottom surface and terminating at a recessed surface therebetween, the vacuum channel being aligned with the passageway of each seating surface region, wherein the vacuum channel is in communication with a vacuum source; and an ejection nozzle having an ejection outlet exposed to the vacuum channel, wherein the ejection nozzle is in communication with a pressurized-air source and wherein the ejection outlet is positioned between the vacuum plate support surface and the recessed surface of the vacuum channel.

10. The component handler of claim 9, wherein the vacuum channel is configured to transmit a suction force from the vacuum source to the passageway of each seating surface region to thereby assist in the retention of a component against a seating surface region, and wherein the ejection nozzle is configured to transmit a fluid into a passageway of a seating surface region to thereby dislodge a retained component from a seating surface region.

11. The component handler of claim 10, wherein the vacuum channel is configured to transmit a suction force to first and second passageways to thereby assist in the retention of first and second components against adjacent first and second seating surface regions, respectively, and wherein the ejection nozzle is configured to transmit the fluid into the first passageway to thereby dislodge the first component from the first seating surface region without dislodging the second component from the second seating surface region.

12. A test plate for supporting multiple components, the test plate comprising: a body portion having a first surface and a second surface that is opposite the first surface; and a plurality of projections extending from the first surface of the body portion, the plurality of projections defining a plurality of seating sidewalls, wherein of the plurality of seating sidewalls, a plurality of pairs of seating sidewalls oppose one another along a first direction and have no projections interposed therebetween, wherein a plurality of rows of the plurality of projections are spaced apart from each other on the first surface test plate along a second direction different from the first direction; and a plurality of component-seating sites, wherein no projection of the plurality of projections overlaps with any component-seating site of the plurality of component-seating sites, wherein each of the plurality of component-seating sites is disposed between one of the plurality of pairs of seating sidewalls and wherein each component-seating site includes a seating surface region arranged between one of the plurality of pairs of seating sidewalls, the seating surface region extending from one sidewall to the other sidewall in one of the plurality of pairs of seating sidewalls and, against which, a component is retainable; and a plurality of passages extending through the body portion, wherein each of the plurality of passages intersects the seating surface region of a component-seating site arranged between one of the plurality of pairs of seating sidewalls and the second surface, wherein a maximum width of a portion of the passage intersecting the seating surface region interposed between one of the plurality of pairs of seating sidewalls is less than a distance between sidewalls in the pair of seating sidewalls.

13. The test plate of claim 12, wherein a thickness of the body portion between the first surface and the second surface is greater than or equal to the distance between sidewalls at least one of the plurality of pairs of seating sidewalls.

14. The test plate of claim 12, wherein each projection of the plurality of projections has a projection surface between adjacent seating walls of different component-seating sites, wherein the projection surface and the adjoining seating walls have probe recesses positioned so as to be adjacent to lateral terminations of an electrical component.

15. The test plate of claim 12, wherein each projection of the plurality of projections has a projection surface between adjacent seating walls of different component-seating sites, wherein the projection surface has a height with respect to the seating surface region such that the height is less than the width dimension of an electrical component seated on the seating surface region.

16. The test plate of claim 12, wherein at least three component-seating sites of the plurality of component-seating sites are arranged equidistant from a common location on the first surface of the body portion.

17. The test plate of claim 12, further comprising at least one passage intersecting both the second surface of the body portion and a seating sidewall of a component-seating site.

18. The test plate of claim 12, wherein the seating surface region is spaced apart from the second surface.

19. The test plate of claim 18, wherein the seating surface region is flush with the first surface.

20. The test plate of claim 18, wherein the seating surface region is recessed with respect to the first surface.

21. The test plate of claim 12, wherein each of the plurality of projections defines at least at two seating sidewalls.

22. The test plate of claim 21, wherein each of the plurality of projections defines at least at four seating sidewalls.

23. A method of handling components, the method comprising: providing a test plate including a body portion having a first surface and a planar second surface that is opposite the first surface, wherein the test plate includes a component-seating track arranged on the first surface of the body portion, wherein the component-seating track includes multiple component-seating sites, wherein each of the component-seating sites is configured to retain a component, wherein the test plate comprises protrusions between adjacent component-seating sites, wherein adjacent protrusions have seating walls that face each other on opposite sides of each component-seating site along a first direction, and wherein a plurality of rows of the plurality of protrusions are spaced apart from each other on the first surface test plate along a second direction different from the first direction; loading components onto the test plate; retaining at least some of the loaded components at a component-seating site of the test plate such that no portion of any retained component is present within a plane defined by the second surface; and while retaining the components at respective component-seating sites of the test plate, testing the retained components.

24. The method of claim 23, wherein the test plate is a circular test plate having a center and a peripheral edge, wherein each protrusion has a loading wall that is closer to the center than to the peripheral edge, wherein each component-seating site is accessible by a radially proximal aperture between adjacent protrusions and closer to the center than to the peripheral edge, and wherein loading multiple components comprises:
 inclining the test plate at a nonzero angle with respect to horizontal;
 rotating the test plate;
 introducing a stream of the components onto the test plate as the test plate is rotating; and
 confining components to tumble, due to gravity, over the radially proximal apertures of empty component-seating sites that passing through an arc of a rotation path of the test plate, the random tumbling over the passing component-seating sites resulting in the seating of the components.

25. The method of claim 23, wherein the components include electrical components.

26. A component handler having a component loading region, the component handler comprising: a base; a test plate moveably coupled to the base, the test plate including: a body portion having a surface that is planar; protrusions extending from the surface of the body portion; and component-seating sites, wherein each of the component-seating sites is disposed between a pair of adjacent protrusions and is configured to retain a component, wherein the test plate is movable such that the component-seating sites are conveyable into and out of a component loading region along a component seat travel path, wherein each of the protrusions includes a first sidewall extending from the surface of the body portion and arranged in the component seat travel path, a pair of second sidewalls extending from the first surface and arranged at opposite sides of the first sidewall, and a protrusion surface located between the first sidewall and the pair of second sidewalls and spaced apart from the surface of the body portion, and wherein the test plate is inclined at a non-horizontal angle such that, within the component loading region, a first portion of the surface of the body portion adjacent to one sidewall in the pair of second sidewalls is elevationally-lower than a second portion of the surface of the body portion adjacent to another sidewall in the pair of second sidewalls; and a load fence coupled to the base and closely adjacent to, but spaced apart from, the surface of the body portion and the protrusions such that a gap between the load fence and the second portion of the surface of the body portion is less than a maximum height to which the protrusions extend from the surface of the body portion, and such that a gap between the load fence and one sidewall in the pair of second sidewalls of the protrusions is less than a dimension a component retainable at a component receiving site, the dimension being at least one selected from the group consisting of a thickness dimension, a width dimension and a length dimension of a component retainable at a component receiving site.

* * * * *